(12) United States Patent
Choi

(10) Patent No.: US 12,289,934 B2
(45) Date of Patent: Apr. 29, 2025

(54) DISPLAY DEVICE USING MICRO LED, AND METHOD FOR MANUFACTURING SAME

(71) Applicant: LG ELECTRONICS INC., Seoul (KR)

(72) Inventor: Hwanjoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 670 days.

(21) Appl. No.: 17/619,162

(22) PCT Filed: Jun. 21, 2019

(86) PCT No.: PCT/KR2019/007526
§ 371 (c)(1),
(2) Date: Dec. 14, 2021

(87) PCT Pub. No.: WO2020/256191
PCT Pub. Date: Dec. 24, 2020

(65) Prior Publication Data
US 2022/0336712 A1     Oct. 20, 2022

(30) Foreign Application Priority Data
Jun. 21, 2019   (KR) .......................... 10-2019-0074020

(51) Int. Cl.
*H01L 33/44*     (2010.01)
*H01L 25/075*    (2006.01)
(Continued)

(52) U.S. Cl.
CPC ......... *H10H 20/84* (2025.01); *H01L 25/0753* (2013.01); *H10H 20/82* (2025.01);
(Continued)

(58) Field of Classification Search
CPC ..... H01L 33/44; H01L 25/0753; H01L 33/22; H01L 24/32; H01L 24/83; H01L 24/95;
(Continued)

(56) References Cited

U.S. PATENT DOCUMENTS

| 4,664,748 A | 5/1987 | Ueno et al. |
| 6,441,403 B1 * | 8/2002 | Chang ..................... H01L 33/22 257/97 |

(Continued)

FOREIGN PATENT DOCUMENTS

| KR | 10-0674854 B1 | 1/2007 |
| KR | 10-2008-0029177 A | 4/2008 |

(Continued)

*Primary Examiner* — Vu A Vu
(74) *Attorney, Agent, or Firm* — Birch, Stewart, Kolasch & Birch, LLP

(57) ABSTRACT

A semiconductor light emitting element for a display device can include a semiconductor light emitting structure including a first conductivity type semiconductor layer, an active layer, and a second conductivity type semiconductor layer; and a light extraction structure disposed on top of the second conductivity type semiconductor layer of the semiconductor light emitting structure, in which the light extraction structure includes a plurality of organic protrusions protruding in a vertical direction of the second conductivity type semiconductor layer; and a surface roughness pattern formed on at least a portion of a top surface of the second conductivity type semiconductor layer, and at least one of the plurality of organic protrusions contains nanoparticles positioned at an end of the at least one of the plurality of organic protrusions and an organic component supporting the nanoparticles.

21 Claims, 31 Drawing Sheets

(51) Int. Cl.
  *H10H 20/82* (2025.01)
  *H10H 20/84* (2025.01)
  *H01L 23/00* (2006.01)
  *H10H 20/01* (2025.01)
  *H10H 20/80* (2025.01)

(52) U.S. Cl.
  CPC .............. *H01L 24/32* (2013.01); *H01L 24/83* (2013.01); *H01L 24/95* (2013.01); *H01L 2224/32225* (2013.01); *H01L 2224/83851* (2013.01); *H01L 2224/951* (2013.01); *H10H 20/01335* (2025.01); *H10H 20/034* (2025.01); *H10H 20/882* (2025.01)

(58) Field of Classification Search
  CPC ......... H01L 33/007; H01L 2224/32225; H01L 2224/83851; H01L 2224/951; H01L 2933/0025; H01L 2933/0091; H01L 33/504; H01L 33/0093; H01L 33/62; H01L 33/32; H01L 33/58; H01L 25/167; H01L 2933/0058; H01L 27/156; H01L 33/0008; H01L 33/0075
  USPC .......................................................... 257/76
  See application file for complete search history.

(56) References Cited

U.S. PATENT DOCUMENTS

| | | | | |
|---|---|---|---|---|
| 6,614,172 B2 * | 9/2003 | Chiu | ................ | H01L 33/22 |
| | | | | 257/E33.074 |
| 7,476,910 B2 * | 1/2009 | Fujimoto | ................ | H01L 33/22 |
| | | | | 257/E33.068 |
| 7,524,686 B2 * | 4/2009 | Chu | ................ | H01L 33/20 |
| | | | | 438/22 |
| 7,675,075 B2 * | 3/2010 | Nagai | ................ | H01L 27/156 |
| | | | | 257/E33.057 |
| 7,897,420 B2 * | 3/2011 | Chu | ................ | H01L 33/22 |
| | | | | 257/98 |
| 7,951,625 B2 * | 5/2011 | Kamei | ................ | H01L 33/0093 |
| | | | | 257/E33.056 |
| 8,198,645 B2 * | 6/2012 | Sakai | ................ | H01L 33/22 |
| | | | | 438/46 |
| 8,227,281 B2 * | 7/2012 | Okada | ................ | H01L 33/0083 |
| | | | | 438/46 |
| 8,653,552 B2 * | 2/2014 | Kazama | ................ | H01L 33/14 |
| | | | | 257/98 |
| 8,841,220 B2 * | 9/2014 | Fujikane | ................ | H01L 33/58 |
| | | | | 438/718 |
| 8,896,008 B2 * | 11/2014 | Donofrio | ................ | H01L 33/32 |
| | | | | 257/98 |
| 9,012,933 B2 * | 4/2015 | Chi | ................ | H01L 33/0095 |
| | | | | 257/E31.13 |
| 9,048,377 B2 * | 6/2015 | Kang | ................ | H01L 33/20 |
| 9,224,916 B2 * | 12/2015 | Yamasaki | ................ | H01L 33/145 |
| 9,224,917 B2 * | 12/2015 | Seo | ................ | H01L 33/22 |
| 9,543,485 B2 * | 1/2017 | Jung | ................ | H01L 33/22 |
| 9,634,191 B2 * | 4/2017 | Keller | ................ | H01L 33/08 |
| 9,806,262 B2 * | 10/2017 | Kwon | ................ | H10K 71/50 |
| 9,941,452 B2 * | 4/2018 | Mao | ................ | H01L 33/62 |
| 10,319,881 B2 * | 6/2019 | Shatalov | ................ | G06F 30/30 |
| 2006/0056474 A1 | 3/2006 | Fujimoto et al. | | |
| 2007/0166851 A1 | 7/2007 | Tran et al. | | |
| 2008/0142814 A1 | 6/2008 | Chu et al. | | |
| 2013/0248877 A1 | 9/2013 | Fujikane et al. | | |
| 2014/0346545 A1 | 11/2014 | Chan et al. | | |
| 2017/0222106 A1 * | 8/2017 | Nakabayashi | .......... | H01L 33/54 |
| 2018/0254386 A1 * | 9/2018 | Perzlmaier | ............ | H01L 33/62 |

FOREIGN PATENT DOCUMENTS

| | | |
|---|---|---|
| KR | 10-2011-0101712 A | 9/2011 |
| KR | 10-2013-0009040 A | 1/2013 |
| KR | 10-2015-0010113 A | 1/2015 |
| KR | 10-2017-0005681 A | 1/2017 |
| KR | 10-2018-0018700 A | 2/2018 |
| KR | 10-2271159 B1 | 7/2021 |
| WO | WO 2017/018507 A1 | 2/2017 |

* cited by examiner

FIG. 12
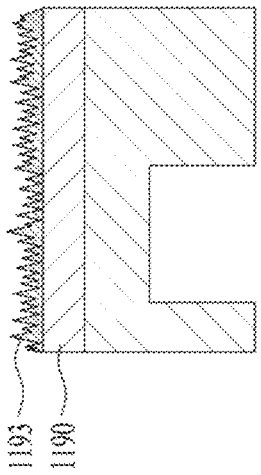
(a)
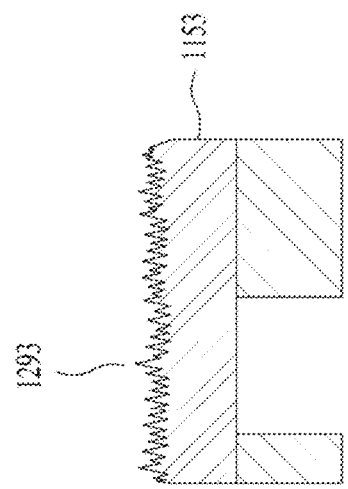
(b)
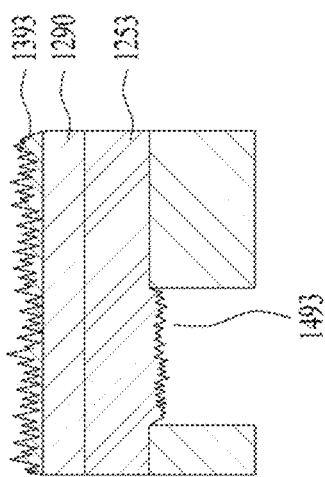
(c)

DISPLAY DEVICE USING MICRO LED, AND METHOD FOR MANUFACTURING SAME

CROSS REFERENCE TO RELATED APPLICATIONS

This application is the National Phase of PCT International Application No. PCT/2019/007526, filed on Jun. 21, 2019, which claims priority under 35 U.S.C. § 119 (a) to Patent Application No. 10-2019-0074020, filed in the Republic of Korea on Jun. 21, 2019, all of these applications being hereby expressly incorporated by reference into the present application.

BACKGROUND

Technical Field

The present disclosure is applicable to a display device-related technical field, and relates, for example, to a display device using a micro light emitting diode (LED), and a method for manufacturing the same.

Background Art

Recently, in a field of a display technology, display devices having excellent characteristics such as thinness, flexibility, and the like have been developed. On the other hand, currently commercialized major displays are represented by a LCD (liquid crystal display) and an OLED (organic light emitting diode).

However, the LCD has a response time is not fast and it is difficult for the LCD to be flexibly implemented. In addition, the OLED has a short lifespan and has a mass production yield that is not good.

On the other hand, LED (light emitting diode), which is a well-known semiconductor light-emitting element that converts electric current into light, has been used as a light source for a display image of an electronic device including an information and communication device along with a GaP:N-based green LED, starting with commercialization of a red LED using a GaAsP compound semiconductor in 1962. Accordingly, a method for solving the above-described problems by implementing a display using the semiconductor light-emitting element may be proposed. Such light emitting diode has various advantages, such as long lifespan, low power consumption, excellent initial driving characteristics, high vibration resistance, and the like, compared to a filament-based light-emitting element.

Such semiconductor light emitting elements are gradually being studied focusing on high-power and high-efficiency products. In particular, a gallium nitride (GaN)-based semiconductor light emitting element is being studied intensively.

The GaN-based semiconductor light emitting element has high efficiency in terms of light generation because of relatively good internal quantum efficiency. However, a light extraction efficiency is low due to a high refractive index (in a range from 2.3 to 2.8) compared to a surrounding material. Therefore, in the GaN-based semiconductor light emitting element having a general structure, a significant portion of light generated from an active layer is extinguished inside without being able to be extracted to the outside of the element. Moreover, the light that was not able to escape the semiconductor light emitting element is converted to heat while traveling inside the semiconductor light emitting element, resulting in lower luminous efficiency and increased heat generation, thereby shortening a life of the semiconductor light emitting element.

Therefore, in order to implement the display device using the semiconductor light emitting element, a development of a semiconductor light emitting element having excellent light extraction efficiency is required.

SUMMARY

Technical Problem

An object of an embodiment of the present disclosure is to provide a display device using a semiconductor light emitting element and a method for manufacturing the same.

Another object of an embodiment of the present disclosure is to provide a display device using a semiconductor light emitting element that may be manufactured by a simple process and have excellent light extraction efficiency, and a method for manufacturing the same.

Furthermore, another object of an embodiment of the present disclosure is to solve various problems not mentioned herein. A person skilled in the art may understand through the whole spirit of the specification and drawings.

Technical Solutions

A display device including a plurality of semiconductor light emitting elements for achieving the purpose described above is provided. Specifically, at least one of the semiconductor light emitting elements disclosed in the present disclosure includes a semiconductor light emitting structure including a first conductivity type semiconductor layer, an active layer, and a second conductivity type semiconductor layer, and a light extraction structure disposed on top of the second conductivity type semiconductor layer of the semiconductor light emitting structure, the light extraction structure includes a plurality of organic protrusions protruding in a vertical direction of the second conductivity type semiconductor layer, and a surface roughness pattern formed in a certain region of a top surface of the second conductivity type semiconductor layer, at least one of the plurality of organic protrusions contains nanoparticles positioned at an end thereof and an organic component supporting the nanoparticles, the top surface of the second conductivity type semiconductor layer includes a first interface where a first organic protrusion among the plurality of organic protrusions is located, a second interface where a second organic protrusion among the plurality of organic protrusions is located, and a third interface located between the first interface and the second interface, wherein the organic protrusion is not located at the third interface, and the surface roughness pattern is formed on the third interface.

As an embodiment, the nanoparticles and the second conductivity type semiconductor layer have different etching ratios, and a first etching ratio of the nanoparticles is lower than a second etching ratio of the second conductivity type semiconductor layer.

As an embodiment, a first refractive index of the plurality of organic protrusions is lower than a second refractive index of the second conductivity type semiconductor layer.

As an embodiment, the nanoparticles include at least one of $TiO_2$, $ZnO$, $ZrO_2$, $SiO_2$, $Al_2O_3$, and $SiNx$.

As an embodiment, the semiconductor light emitting element is an LED (micro-LED) having a micrometer unit size.

As an embodiment, one of the first conductivity type semiconductor layer and the second conductivity type semiconductor layer is a P-type GaN layer, and the other is an N-type GaN layer.

As an embodiment, the organic component is a photosensitive organic component.

As an embodiment, the photosensitive organic component includes at least one of a photosensitive acrylate and a photo active compound (PAC).

A method for manufacturing a display device using a semiconductor light emitting element according to another embodiment of the present disclosure includes forming a semiconductor light emitting structure including a first conductivity type semiconductor layer, an active layer, and a second conductivity type semiconductor layer on a first substrate, coating an organic layer containing dispersed nanoparticles on top of the semiconductor light emitting structure, performing ashing such that at least some of the nanoparticles are exposed at a surface of the organic layer, and forming a light extraction structure on top of the semiconductor light emitting structure through an etching process using a portion of the organic layer remaining after the ashing as an etching mask.

As an embodiment, the light extraction structure includes an irregular surface roughness pattern formed on a top surface of the semiconductor light emitting structure by the etching process.

As an embodiment, the light extraction structure includes a plurality of organic protrusions formed by the etching process, and at least one of the plurality of organic protrusions has the nanoparticles at an end thereof.

As an embodiment, the method further includes transferring the semiconductor light emitting structure to a second substrate between the forming of the semiconductor light emitting structure and the coating of the organic layer.

As an embodiment, the coating of the organic layer includes applying an organic solution on top of the semiconductor light emitting structure, and then performing soft baking on the organic solution by heat.

As an embodiment, the organic layer is a photosensitive organic layer, and the method further includes forming the light extraction structure only in a region overlapping the active layer of the semiconductor light emitting structure through a photo-lithography process.

As an embodiment, the semiconductor light emitting structure includes a buffer semiconductor layer, and the organic layer is coated on top of the buffer semiconductor layer of the semiconductor light emitting element.

As an embodiment, the performing of the ashing uses an $O_2$ plasma.

Advantageous Effects

According to one embodiment of the present disclosure, it is possible to provide the display device using the semiconductor light emitting element, and the method for manufacturing the same.

In addition, it is possible to provide the display device using the semiconductor light emitting element that may be manufactured with the simple process and have the excellent light extraction efficiency, and the method for manufacturing the same.

Specifically, after the organic layer containing the plurality of nanoparticles are coated on the semiconductor light emitting structure, the organic layer is ashed such that the nanoparticles are exposed on the surface of the organic layer, and the ashed organic layer is used as the etching mask by doing, so that the light extraction efficiency may be improved by making the surface of the semiconductor light emitting element have the irregular surface roughness pattern.

Therefore, by allowing the light generated inside the semiconductor light emitting element to be effectively emitted to the outside without being lost in the surroundings, luminance of the display device is improved and deterioration of the element is reduced, so that there is a positive effect in terms of high-temperature reliability.

Furthermore, according to another embodiment of the present disclosure, there are additional technical effects not mentioned herein. Those of ordinary skill in the art may understand it through the full text of the specification and drawings.

DESCRIPTION OF DRAWINGS

FIG. 12 shows cross-sectional views showing semiconductor light emitting elements having a light extraction structure at various positions;

DETAILED DESCRIPTION OF THE EMBODIMENTS

Reference will now be made in detail to embodiments of the present disclosure, examples of which are illustrated in the accompanying drawings. Wherever possible, the same reference numbers will be used throughout the drawings to refer to the same or like parts, and redundant description thereof will be omitted. As used herein, the suffixes "module" and "unit" are added or used interchangeably to facilitate preparation of this specification and are not intended to suggest distinct meanings or functions. In describing embodiments disclosed in this specification, relevant well-known technologies may not be described in detail in order not to obscure the subject matter of the embodiments disclosed in this specification. In addition, it should be noted that the accompanying drawings are only for easy understanding of the embodiments disclosed in the present specification, and should not be construed as limiting the technical spirit disclosed in the present specification.

Furthermore, although the drawings are separately described for simplicity, embodiments implemented by combining at least two or more drawings are also within the scope of the present disclosure.

In addition, when an element such as a layer, region or module is described as being "on" another element, it is to be understood that the element may be directly on the other element or there may be an intermediate element between them.

The display device described herein is a concept including all display devices that display information with a unit pixel or a set of unit pixels. Therefore, the display device may be applied not only to finished products but also to parts. For example, a panel corresponding to a part of a digital TV also independently corresponds to the display device in the present specification. The finished products include a mobile phone, a smartphone, a laptop, a digital broadcasting terminal, a personal digital assistant (PDA), a portable multimedia player (PMP), a navigation system, a slate PC, a tablet, an Ultrabook, a digital TV, a desktop computer, and the like.

However, it will be readily apparent to those skilled in the art that the configuration according to the embodiments described herein is applicable even to a new product that will be developed later as a display device.

In addition, the semiconductor light emitting element mentioned in this specification is a concept including an LED, a micro LED, and the like, and may be used interchangeably therewith.

Figure 1:
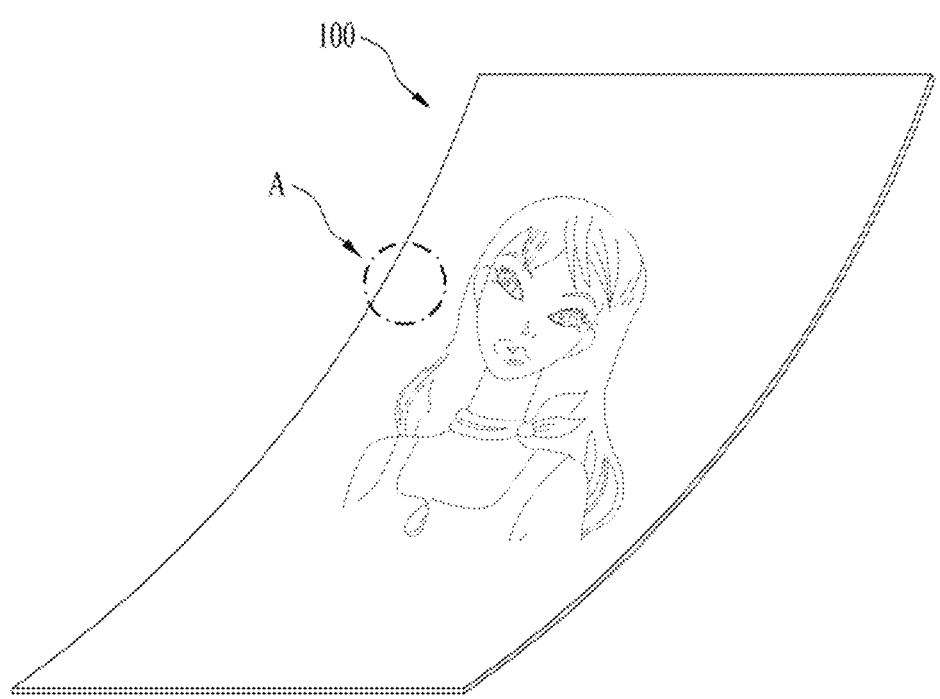
FIG. 1 is a conceptual diagram illustrating an embodiment of a display device using a semiconductor light emitting element according to the present disclosure.

FIG. 1 is a conceptual view illustrating an embodiment of a display device using a semiconductor light emitting element according to the present disclosure.

As shown in FIG. 1, information processed by a controller (not shown) of a display device 100 may be displayed using a flexible display.

The flexible display may include, for example, a display that can be warped, bent, twisted, folded, or rolled by external force.

Furthermore, the flexible display may be, for example, a display manufactured on a thin and flexible substrate that can be warped, bent, folded, or rolled like paper while maintaining the display characteristics of a conventional flat panel display.

When the flexible display remains in an unbent state (e.g., a state having an infinite radius of curvature) (hereinafter referred to as a first state), the display area of the flexible display forms a flat surface. When the display in the first sate is changed to a bent state (e.g., a state having a finite radius of curvature) (hereinafter referred to as a second state) by external force, the display area may be a curved surface. As shown in FIG. 1, the information displayed in the second state may be visual information output on a curved surface. Such visual information may be implemented by independently controlling the light emission of sub-pixels arranged in a matrix form. The unit pixel may mean, for example, a minimum unit for implementing one color.

The unit pixel of the flexible display may be implemented by a semiconductor light emitting element. In the present disclosure, a light emitting diode (LED) is exemplified as a type of the semiconductor light emitting element configured to convert electric current into light. The LED may be formed in a small size, and may thus serve as a unit pixel even in the second state.

Hereinafter, a flexible display implemented using the LED will be described in more detail with reference to the drawings.

Figure 2:
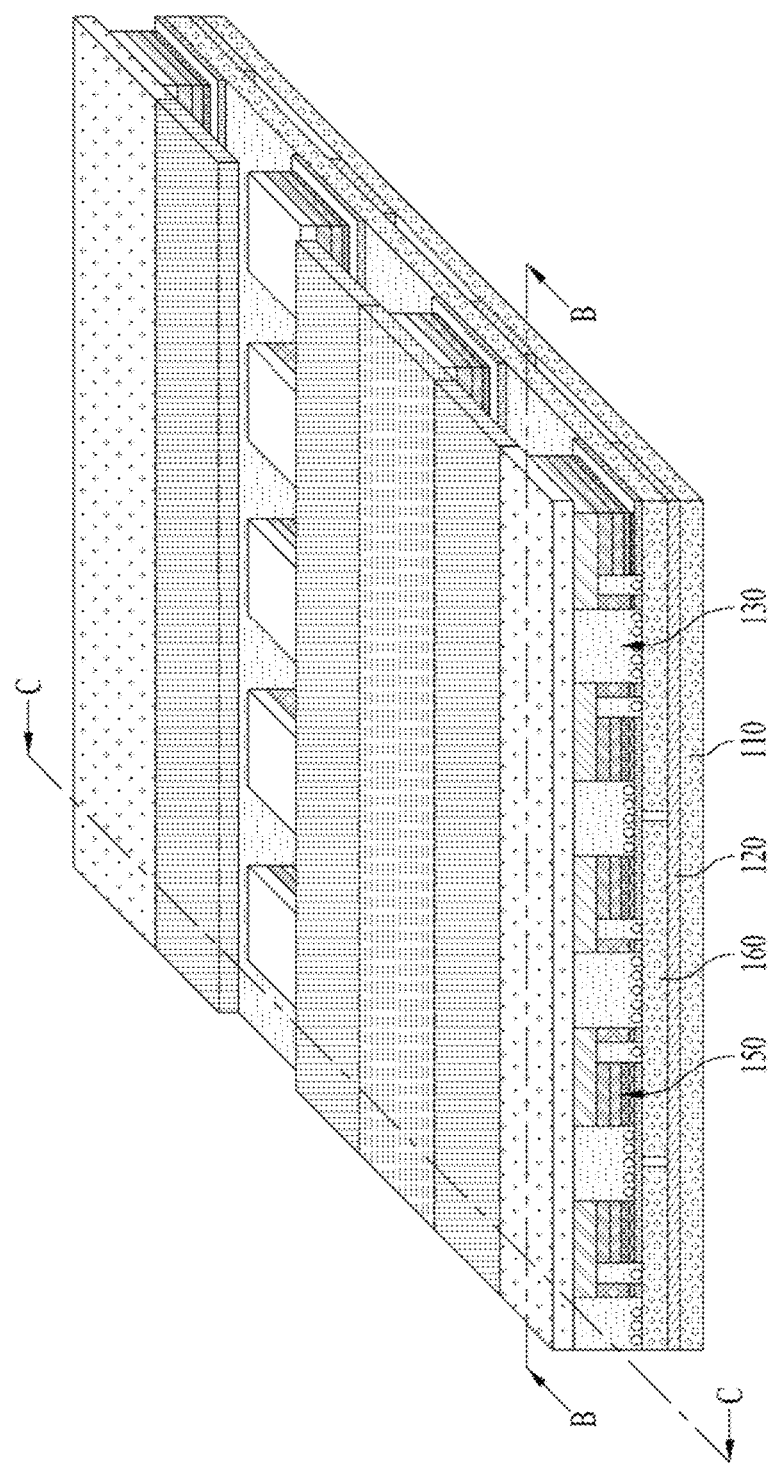
FIG. 2 is a partially enlarged diagram showing a part A shown in FIG. 1.

FIG. 2 is a partially enlarged view showing part A of FIG. 1.

Figure 3A:
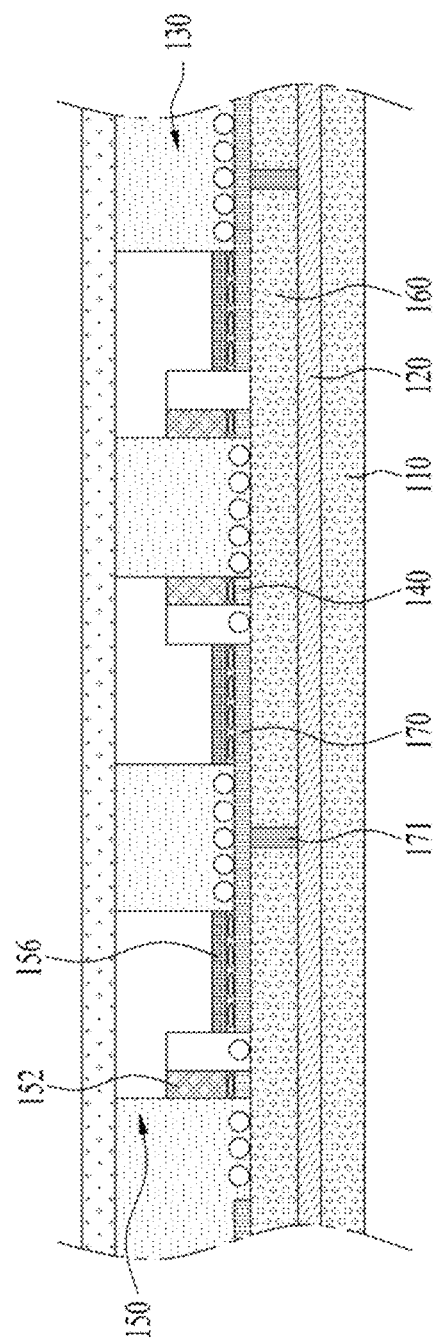
FIGS. 3A and 3B are cross-sectional diagrams taken along the cutting lines B-B and C-C in FIG. 2.
Figure 3B:
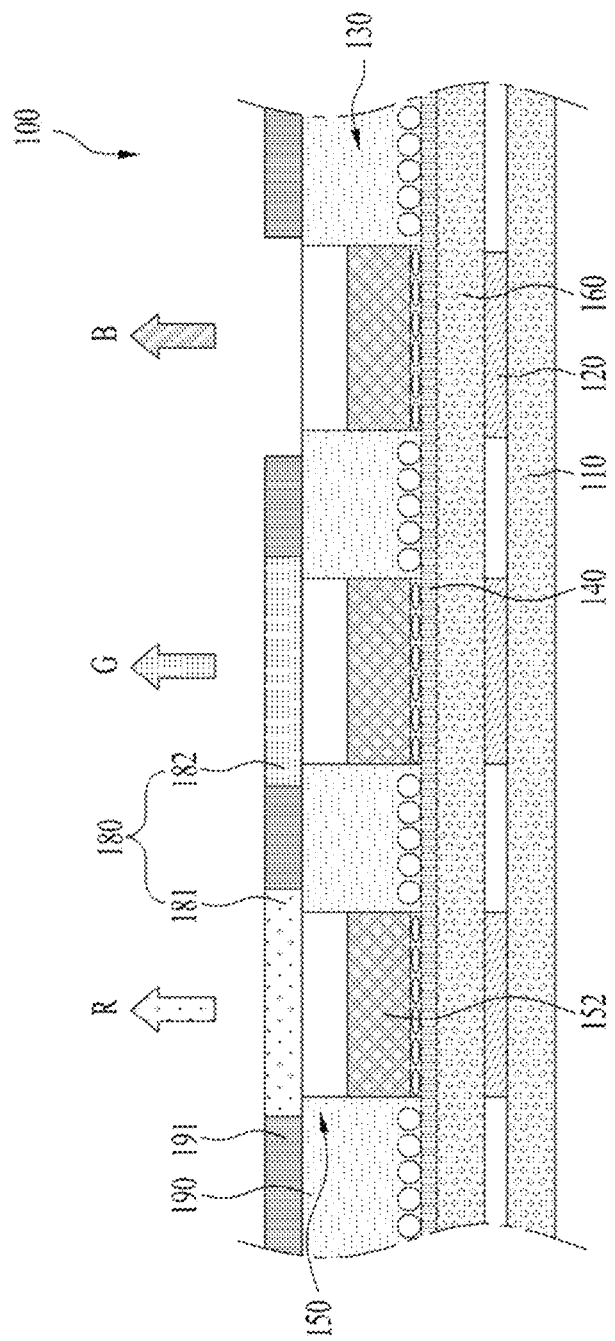

FIGS. 3A and 3B are cross-sectional views taken along lines B-B and C-C in FIG. 2.

Figure 4:
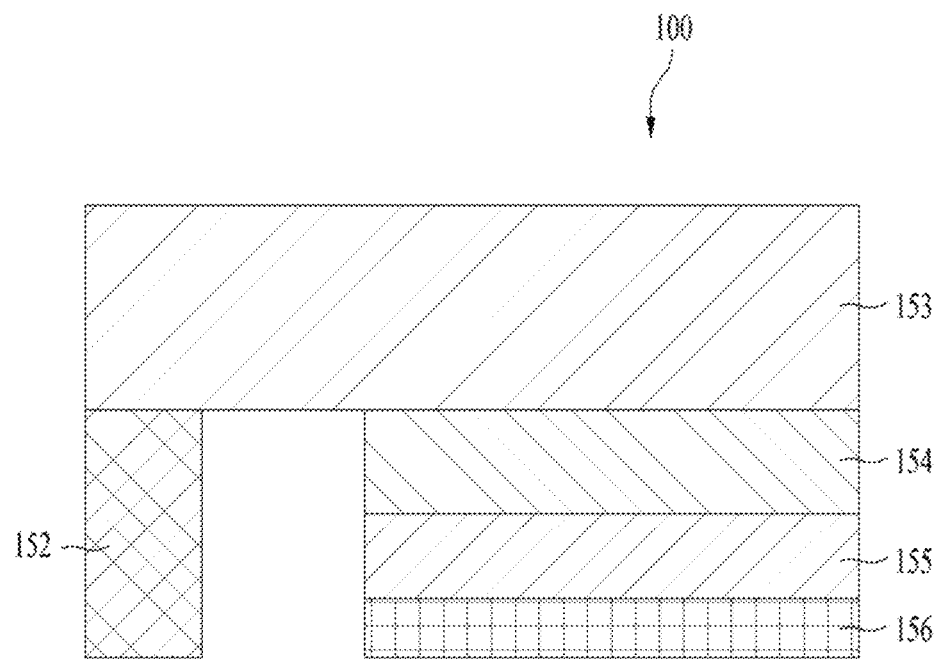
FIG. 4 is a conceptual diagram illustrating the flip-chip type semiconductor light emitting element of FIG. 3.

FIG. 4 is a conceptual view illustrating the flip-chip type semiconductor light emitting element of FIG. 3.

Figure 5A:
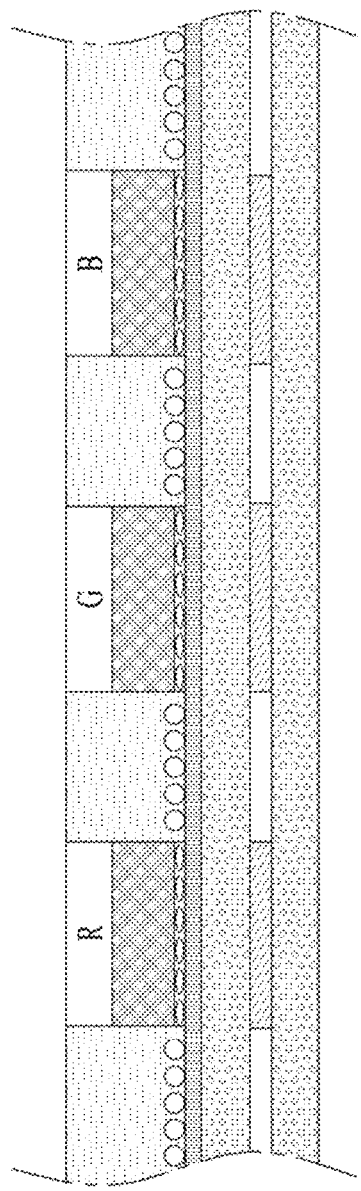
FIGS. 5A to 5C are conceptual diagrams illustrating various examples of color implementation with respect to a flip-chip type semiconductor light emitting element.
Figure 5B:
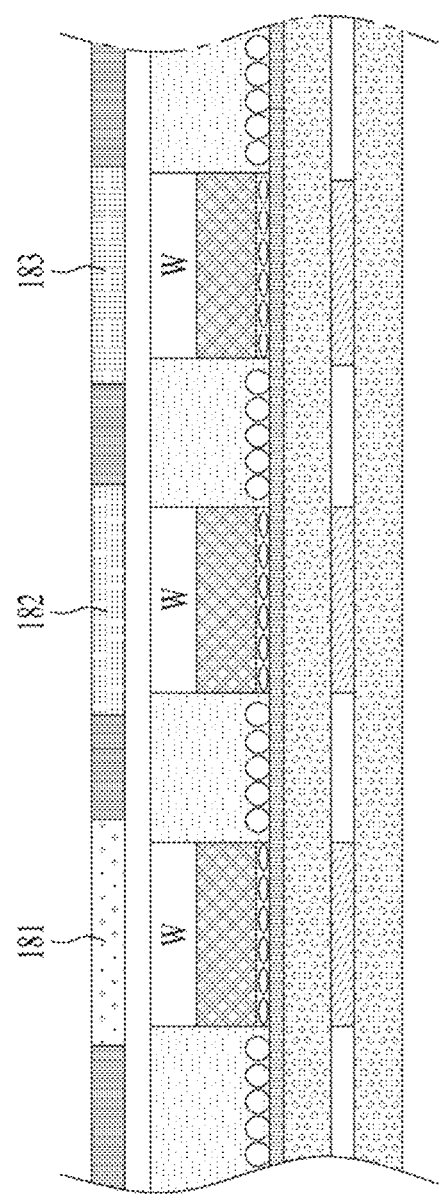
Figure 5C:
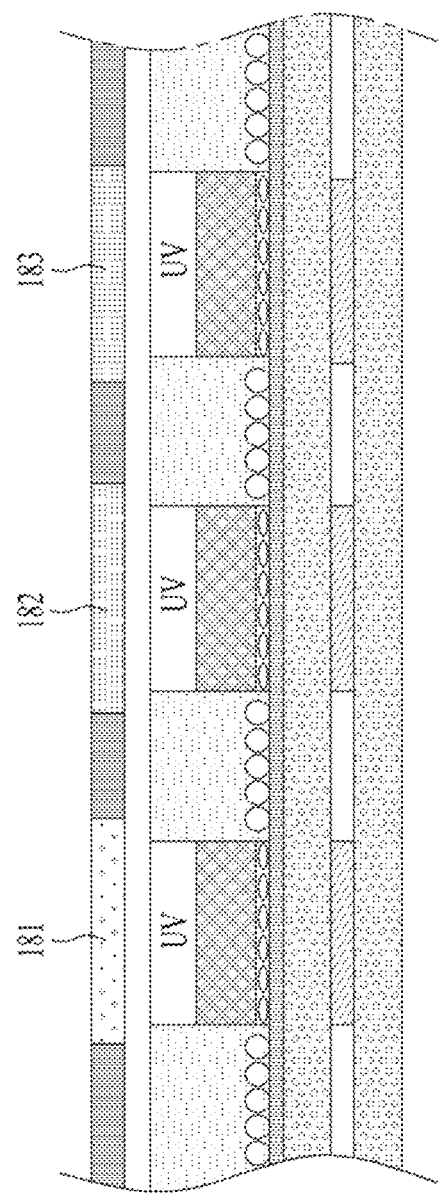

FIGS. 5A to 5C are conceptual views illustrating various examples of implementation of colors in relation to a flip-chip type semiconductor light emitting element.

As shown in FIGS. 2, 3A and 3B, the display device 100 using a passive matrix (PM) type semiconductor light emitting element is exemplified as the display device 100 using a semiconductor light emitting element. However, the examples described below are also applicable to an active matrix (AM) type semiconductor light emitting element.

The display device 100 shown in FIG. 1 may include a substrate 110, a first electrode 120, a conductive adhesive layer 130, a second electrode 140, and at least one semiconductor light emitting element 150, as shown in FIG. 2.

The substrate 110 may be a flexible substrate. For example, to implement a flexible display device, the substrate 110 may include glass or polyimide (PI). Any insulative and flexible material such as polyethylene naphthalate (PEN) or polyethylene terephthalate (PET) may be employed. In addition, the substrate 110 may be formed of either a transparent material or an opaque material.

The substrate 110 may be a wiring substrate on which the first electrode 120 is disposed. Thus, the first electrode 120 may be positioned on the substrate 110.

As shown in FIG. 3A, an insulating layer 160 may be disposed on the substrate 110 on which the first electrode 120 is positioned, and an auxiliary electrode 170 may be positioned on the insulating layer 160. In this case, a stack in which the insulating layer 160 is laminated on the substrate 110 may be a single wiring substrate. More specifically, the insulating layer 160 may be formed of an insulative and flexible material such as PI, PET, or PEN, and may be integrated with the substrate 110 to form a single substrate.

The auxiliary electrode 170, which is an electrode that electrically connects the first electrode 120 and the semiconductor light emitting element 150, is positioned on the insulating layer 160, and is disposed to correspond to the position of the first electrode 120. For example, the auxiliary electrode 170 may have a dot shape and may be electrically connected to the first electrode 120 by an electrode hole 171 formed through the insulating layer 160. The electrode hole 171 may be formed by filling a via hole with a conductive material.

As shown in FIG. 2 or 3A, a conductive adhesive layer 130 may be formed on one surface of the insulating layer 160, but embodiments of the present disclosure are not limited thereto. For example, a layer performing a specific function may be formed between the insulating layer 160 and the conductive adhesive layer 130, or the conductive adhesive layer 130 may be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity. For this purpose, a material having conductivity and a material having adhesiveness may be mixed in the conductive adhesive layer 130. In addition, the conductive adhesive layer 130 may have ductility, thereby providing making the display device flexible.

As an example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the direction of the Z-axis extending through the thickness, but is electrically insulative in the horizontal X-Y direction. Accordingly, the conductive adhesive layer 130 may be referred to as a Z-axis conductive layer (hereinafter, referred to simply as a "conductive adhesive layer").

The ACF is a film in which an anisotropic conductive medium is mixed with an insulating base member. When the ACF is subjected to heat and pressure, only a specific portion thereof becomes conductive by the anisotropic conductive medium. Hereinafter, it will be described that heat and pressure are applied to the ACF. However, another method may be used to make the ACF partially conductive. The other method may be, for example, application of only one of the heat and pressure or UV curing.

In addition, the anisotropic conductive medium may be, for example, conductive balls or conductive particles. For example, the ACF may be a film in which conductive balls are mixed with an insulating base member. Thus, when heat and pressure are applied to the ACF, only a specific portion of the ACF is allowed to be conductive by the conductive balls. The ACF may contain a plurality of particles formed by coating the core of a conductive material with an insulating film made of a polymer material. In this case, as the insulating film is destroyed in a portion to which heat and pressure are applied, the portion is made to be conductive by the core. At this time, the cores may be deformed to form layers that contact each other in the thickness direction of the film. As a more specific example, heat and pressure are applied to the whole ACF, and an electrical connection in the Z-axis direction is partially formed by the height difference of a counterpart adhered by the ACF.

As another example, the ACF may contain a plurality of particles formed by coating an insulating core with a conductive material. In this case, as the conductive material is deformed (pressed) in a portion to which heat and pressure are applied, the portion is made to be conductive in the thickness direction of the film. As another example, the conductive material may be disposed through the insulating base member in the Z-axis direction to provide conductivity in the thickness direction of the film. In this case, the conductive material may have a pointed end.

The ACF may be a fixed array ACF in which conductive balls are inserted into one surface of the insulating base member. More specifically, the insulating base member may be formed of an adhesive material, and the conductive balls may be intensively disposed on the bottom portion of the insulating base member. Thus, when the base member is subjected to heat and pressure, it may be deformed together with the conductive balls, exhibiting conductivity in the vertical direction.

However, the present disclosure is not necessarily limited thereto, and the ACF may be formed by randomly mixing conductive balls in the insulating base member, or may be composed of a plurality of layers with conductive balls arranged on one of the layers (as a double-ACF).

The anisotropic conductive paste may be a combination of a paste and conductive balls, and may be a paste in which conductive balls are mixed with an insulating and adhesive base material. Also, the solution containing conductive particles may be a solution containing any conductive particles or nanoparticles.

Referring back to FIG. 3A, the second electrode 140 is positioned on the insulating layer 160 and spaced apart from the auxiliary electrode 170. That is, the conductive adhesive layer 130 is disposed on the insulating layer 160 having the auxiliary electrode 170 and the second electrode 140 positioned thereon.

After the conductive adhesive layer 130 is formed with the auxiliary electrode 170 and the second electrode 140 positioned on the insulating layer 160, the semiconductor light emitting element 150 is connected thereto in a flip-chip form by applying heat and pressure. Thereby, the semiconductor light emitting element 150 is electrically connected to the first electrode 120 and the second electrode 140.

Referring to FIG. 4, the semiconductor light emitting element may be a flip-chip-type light emitting element.

For example, the semiconductor light emitting element may include a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 disposed on the n-type semiconductor layer 153 and horizontally spaced apart from the p-type electrode 156. In this case, the p-type electrode 156 may be electrically connected to the auxiliary electrode 170, which is shown in FIG. 3, by the conductive adhesive layer 130, and the n-type electrode 152 may be electrically connected to the second electrode 140.

Referring back to FIGS. 2, 3A and 3B, the auxiliary electrode 170 may be elongated in one direction. Thus, one auxiliary electrode may be electrically connected to the plurality of semiconductor light emitting elements 150. For example, p-type electrodes of semiconductor light emitting elements on left and right sides of an auxiliary electrode may be electrically connected to one auxiliary electrode.

More specifically, the semiconductor light emitting element 150 may be press-fitted into the conductive adhesive layer 130 by heat and pressure. Thereby, only the portions of the semiconductor light emitting element 150 between the p-type electrode 156 and the auxiliary electrode 170 and between the n-type electrode 152 and the second electrode 140 may exhibit conductivity, and the other portions of the semiconductor light emitting element 150 do not exhibit conductivity as they are not press-fitted. In this way, the conductive adhesive layer 130 interconnects and electrically connects the semiconductor light emitting element 150 and the auxiliary electrode 170 and interconnects and electrically connects the semiconductor light emitting element 150 and the second electrode 140.

The plurality of semiconductor light emitting elements 150 may constitute a light emitting element array, and a phosphor conversion layer 180 may be formed on the light emitting element array.

The light emitting element array may include a plurality of semiconductor light emitting elements having different luminance values. Each semiconductor light emitting element 150 may constitute a unit pixel and may be electrically connected to the first electrode 120. For example, a plurality of first electrodes 120 may be provided, and the semiconductor light emitting elements may be arranged in, for example, several columns. The semiconductor light emitting elements in each column may be electrically connected to any one of the plurality of first electrodes.

In addition, since the semiconductor light emitting elements are connected in a flip-chip form, semiconductor light emitting elements grown on a transparent dielectric substrate may be used. The semiconductor light emitting elements may be, for example, nitride semiconductor light emitting elements. Since the semiconductor light emitting element 150 has excellent luminance, it may constitute an individual unit pixel even when it has a small size.

As shown in FIG. 3, a partition wall 190 may be formed between the semiconductor light emitting elements 150. In this case, the partition wall 190 may serve to separate individual unit pixels from each other, and may be integrated with the conductive adhesive layer 130. For example, by inserting the semiconductor light emitting element 150 into the ACF, the base member of the ACF may form the partition wall.

In addition, when the base member of the ACF is black, the partition wall 190 may have reflectance and increase contrast even without a separate black insulator.

As another example, a reflective partition wall may be separately provided as the partition wall 190. In this case, the partition wall 190 may include a black or white insulator depending on the purpose of the display device. When a partition wall including a white insulator is used, reflectivity may be increased. When a partition wall including a black insulator is used, it may have reflectance and increase contrast.

The phosphor conversion layer 180 may be positioned on the outer surface of the semiconductor light emitting element 150. For example, the semiconductor light emitting element 150 may be a blue semiconductor light emitting element that emits blue (B) light, and the phosphor conversion layer 180 may function to convert the blue (B) light into a color of a unit pixel. The phosphor conversion layer 180 may be a red phosphor 181 or a green phosphor 182 constituting an individual pixel.

That is, the red phosphor 181 capable of converting blue light into red (R) light may be laminated on a blue semiconductor light emitting element at a position of a unit pixel of red color, and the green phosphor 182 capable of converting blue light into green (G) light may be laminated on the blue semiconductor light emitting element at a position of a unit pixel of green color. Only the blue semiconductor light emitting element may be used alone in the portion constituting the unit pixel of blue color. In this case, unit pixels of red (R), green (G), and blue (B) may constitute one pixel. More specifically, a phosphor of one color may be laminated along each line of the first electrode 120. Accordingly, one line on the first electrode 120 may be an electrode for controlling one color. That is, red (R), green (G), and blue (B) may be sequentially disposed along the second electrode 140, thereby implementing a unit pixel.

However, embodiments of the present disclosure are not limited thereto. Unit pixels of red (R), green (G), and blue (B) may be implemented by combining the semiconductor light emitting element 150 and the quantum dot (QD) rather than using the phosphor.

Also, a black matrix 191 may be disposed between the phosphor conversion layers to improve contrast. That is, the black matrix 191 may improve contrast of light and darkness.

However, embodiments of the present disclosure are not limited thereto, and anther structure may be applied to implement blue, red, and green colors.

Referring to FIG. 5A, each semiconductor light emitting element may be implemented as a high-power light emitting element emitting light of various colors including blue by using gallium nitride (GaN) as a main material and adding indium (In) and/or aluminum (Al).

In this case, each semiconductor light emitting element may be a red, green, or blue semiconductor light emitting element to form a unit pixel (sub-pixel). For example, red, green, and blue semiconductor light emitting elements R, G, and B may be alternately disposed, and unit pixels of red, green, and blue may constitute one pixel by the red, green and blue semiconductor light emitting elements. Thereby, a full-color display may be implemented.

Referring to FIG. 5B, the semiconductor light emitting element 150a may include a white light emitting element W having a yellow phosphor conversion layer, which is provided for each device. In this case, in order to form a unit pixel, a red phosphor conversion layer 181, a green phosphor conversion layer 182, and a blue phosphor conversion layer 183 may be disposed on the white light emitting element W. In addition, a unit pixel may be formed using a color filter repeating red, green, and blue on the white light emitting element W.

Referring to FIG. 5C, a red phosphor conversion layer 181, a green phosphor conversion layer 185, and a blue phosphor conversion layer 183 may be provided on a ultraviolet light emitting element. Not only visible light but also ultraviolet (UV) light may be used in the entire region of the semiconductor light emitting element. In an embodiment, UV may be used as an excitation source of the upper phosphor in the semiconductor light emitting element.

Referring back to this example, the semiconductor light emitting element is positioned on the conductive adhesive layer to constitute a unit pixel in the display device. Since the semiconductor light emitting element has excellent luminance, individual unit pixels may be configured despite even when the semiconductor light emitting element has a small size.

Regarding the size of such an individual semiconductor light emitting element, the length of each side of the device may be, for example, 80 µm or less, and the device may have a rectangular or square shape. When the semiconductor light emitting element has a rectangular shape, the size thereof may be less than or equal to 20 µm×80 µm.

In addition, even when a square semiconductor light emitting element having a side length of 10 µm is used as a unit pixel, sufficient brightness to form a display device may be obtained.

Therefore, for example, in case of a rectangular pixel having a unit pixel size of 600 µm×300 µm (i.e., one side by the other side), a distance of a semiconductor light emitting element becomes sufficiently long relatively.

Thus, in this case, it is able to implement a flexible display device having high image quality over HD image quality.

The above-described display device using the semiconductor light emitting element may be prepared by a new fabricating method. Such a fabricating method will be described with reference to FIG. 6 as follows.

Figure 6:
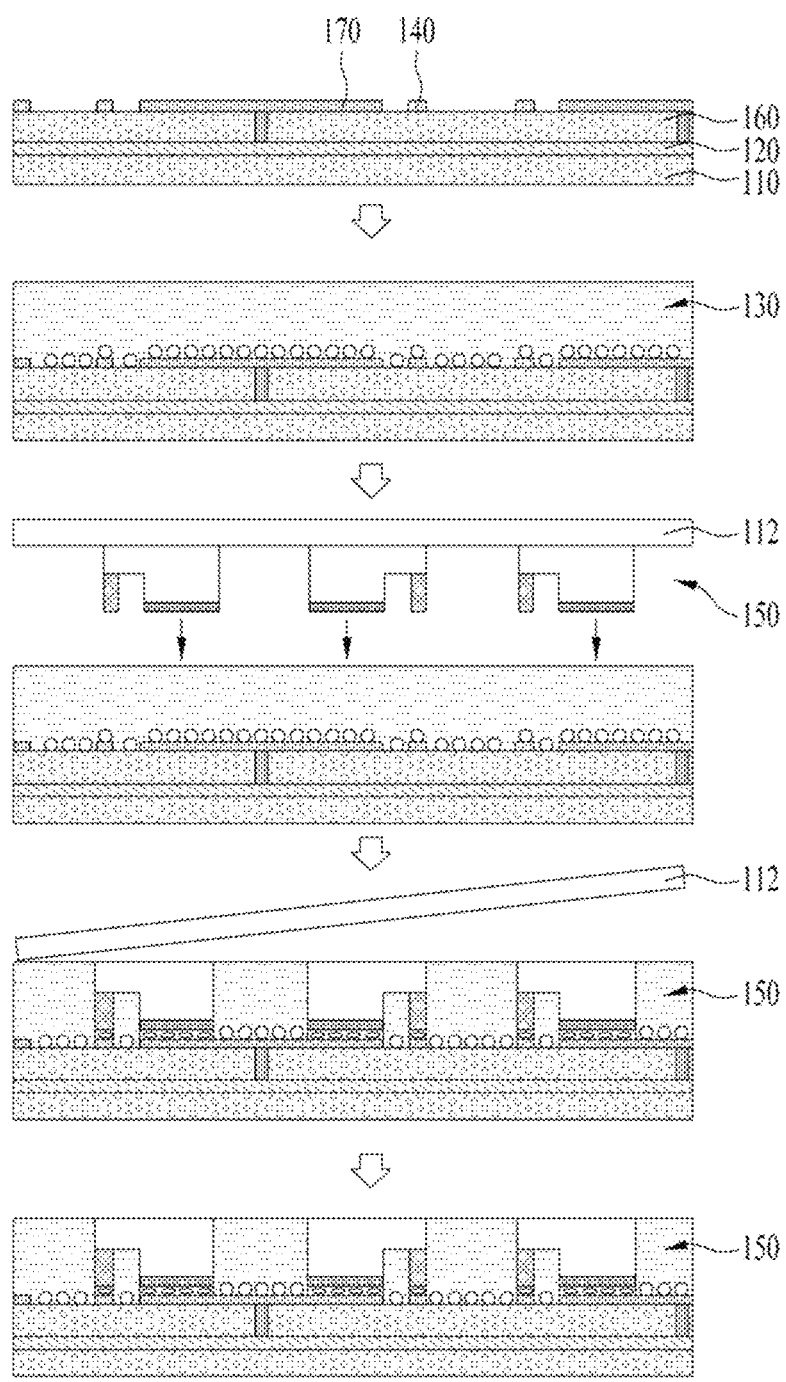
FIG. 6 shows cross-sectional views of a method of fabricating a display device using a semiconductor light emitting element according to the present disclosure.

FIG. 6 shows cross-sectional views of a method of fabricating a display device using a semiconductor light emitting element according to the present disclosure.

Referring to FIG. 6, first of all, a conductive adhesive layer 130 is formed on an insulating layer 160 located between an auxiliary electrode 170 and a second electrode 140. The insulating layer 160 is tacked on a wiring substrate 110. On the wiring substrate 110, a first electrode 120, the auxiliary electrode 170 and the second electrode 140 are disposed. In this case, the first electrode 120 and the second electrode 140 may be disposed in mutually orthogonal directions, respectively. In order to implement a flexible display device, the wiring substrate 110 and the insulating layer 160 may include glass or polyimide (PI) each.

For example, the conductive adhesive layer 130 may be implemented by an anisotropic conductive film. To this end, an anisotropic conductive film may be coated on the substrate on which the insulating layer 160 is located.

Subsequently, a temporary substrate 112, on which a plurality of semiconductor light emitting elements 150 configuring individual pixels are located to correspond to locations of the auxiliary electrode 170 and the second electrodes 140, is disposed in a manner that the semiconductor light emitting element 150 confronts the auxiliary electrode 170 and the second electrode 140.

In this regard, the temporary 112 substrate 112 is a growing substrate for growing the semiconductor light emitting element 150 and may include a sapphire or silicon substrate.

The semiconductor light emitting element is configured to have a space and size for configuring a display device when formed in unit of wafer, thereby being effectively used for the display device.

Subsequently, the wiring substrate 110 and the temporary substrate 112 are thermally compressed together. By the thermocompression, the wiring substrate 110 and the temporary substrate 112 are bonded together. Owing to the property of an anisotropic conductive film having conductivity by thermocompression, only a portion among the semiconductor light emitting element 150, the auxiliary electrode 170 and the second electrode 140 has conductivity, via which the electrodes and the semiconductor light emitting element 150 may be connected electrically. In this case, the semiconductor light emitting element 150 is inserted into the anisotropic conductive film, by which a partition may be formed between the semiconductor light emitting elements 150.

Then the temporary substrate 112 is removed. For example, the temporary substrate 112 may be removed using Laser Lift-Off (LLO) or Chemical Lift-Off (CLO).

Finally, by removing the temporary substrate 112, the semiconductor light emitting elements 150 exposed externally. If necessary, the wiring substrate 110 to which the semiconductor light emitting elements 150 are coupled may be coated with silicon oxide (SiOx) or the like to form a transparent insulating layer (not shown).

In addition, a step of forming a phosphor layer on one side of the semiconductor light emitting element 150 may be further included. For example, the semiconductor light emitting element 150 may include a blue semiconductor light emitting element emitting Blue (B) light, and a red or green phosphor for converting the blue (B) light into a color of a unit pixel may form a layer on one side of the blue semiconductor light emitting element.

The above-described fabricating method or structure of the display device using the semiconductor light emitting element may be modified into various forms. For example, the above-described display device may employ a vertical semiconductor light emitting element.

Furthermore, a modification or embodiment described in the following may use the same or similar reference numbers for the same or similar configurations of the former example and the former description may apply thereto.

Figure 7:
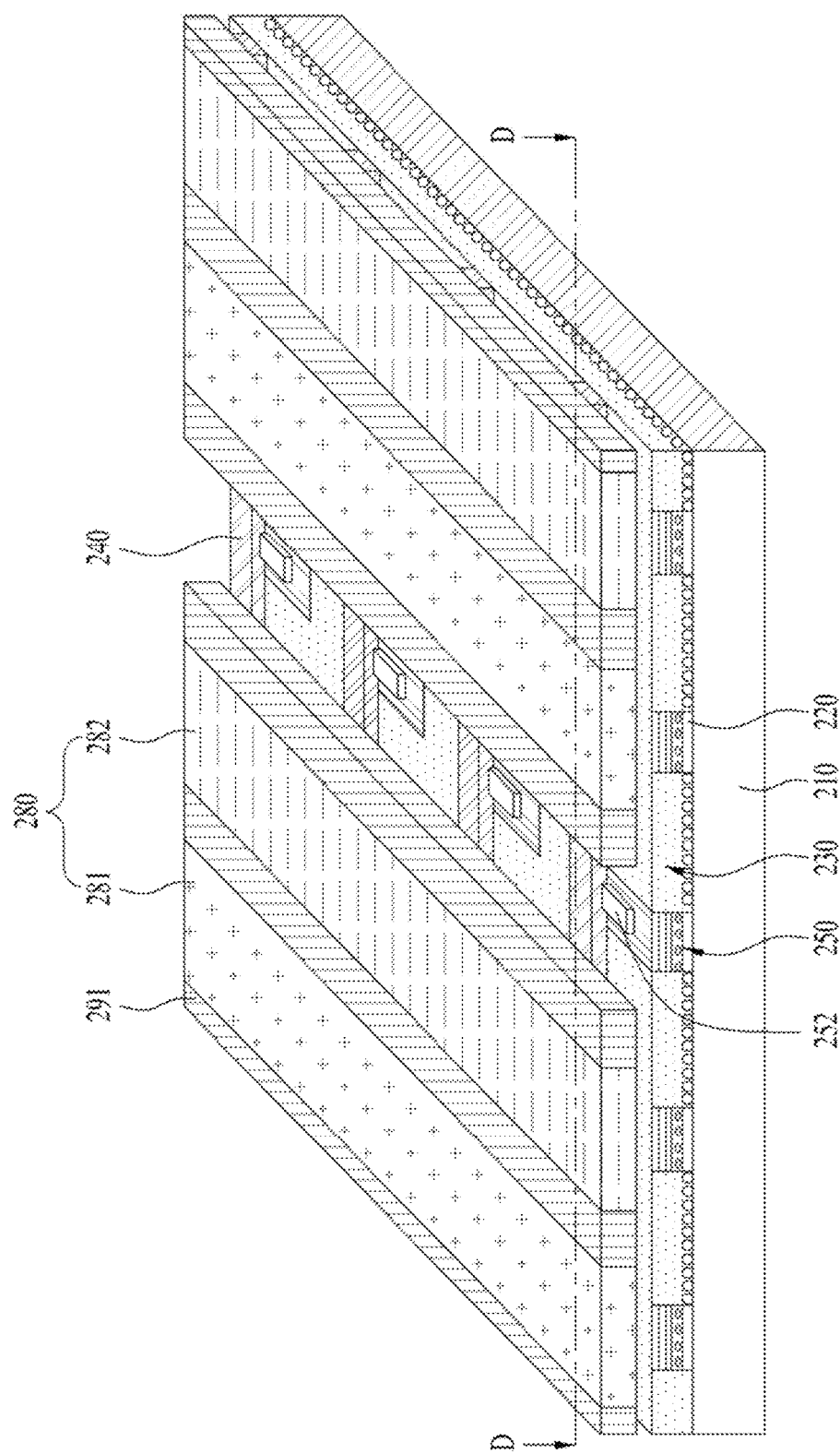
FIG. 7 is a perspective diagram of a display device using a semiconductor light emitting element according to another embodiment of the present disclosure.
Figure 8:
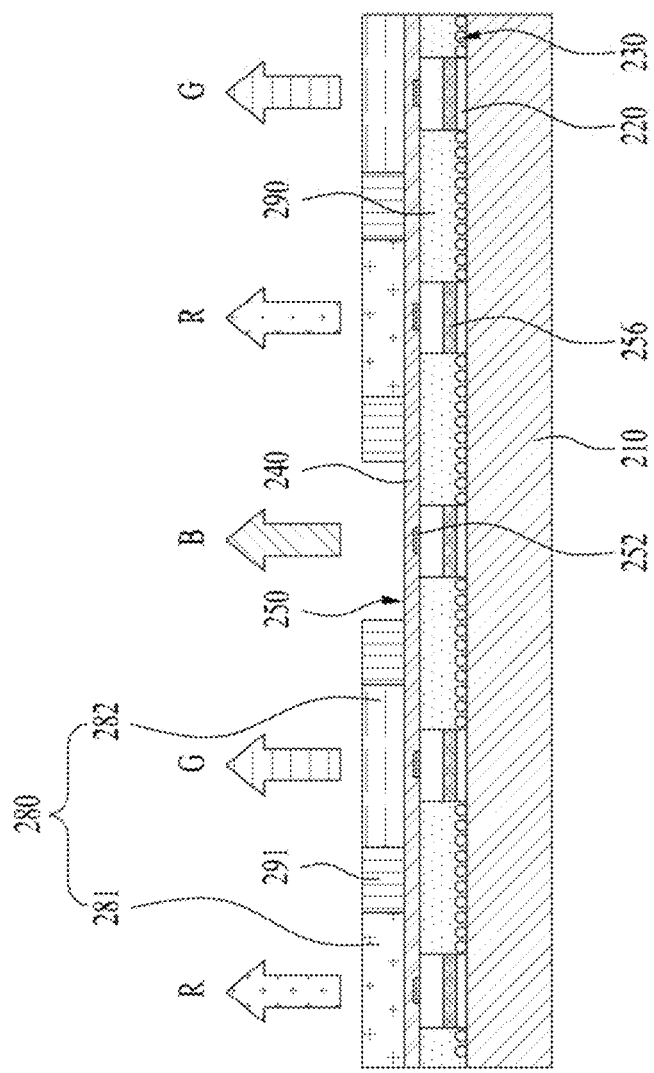
FIG. 8 is a cross-sectional diagram taken along a cutting line D-D shown in FIG. 8.
Figure 9:
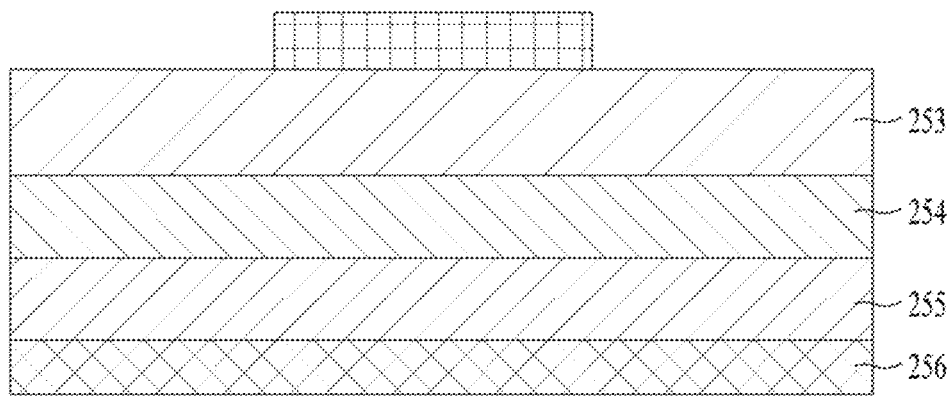
FIG. 9 is a conceptual diagram showing a vertical type semiconductor light emitting element shown in FIG. 8.

FIG. 7 is a perspective diagram of a display device using a semiconductor light emitting element according to another embodiment of the present disclosure, FIG. 8 is a cross-sectional diagram taken along a cutting line D-D shown in FIG. 8, and FIG. 9 is a conceptual diagram showing a vertical type semiconductor light emitting element shown in FIG. 8.

Referring to the present drawings, a display device may employ a vertical semiconductor light emitting element of a Passive Matrix (PM) type.

The display device includes a substrate 210, a first electrode 220, a conductive adhesive layer 230, a second electrode 240 and at least one semiconductor light emitting element 250.

The substrate 210 is a wiring substrate on which the first electrode 220 is disposed and may contain polyimide (PI) to implement a flexible display device. Besides, the substrate 210 may use any substance that is insulating and flexible.

The first electrode 210 is located on the substrate 210 and may be formed as a bar type electrode that is long in one direction. The first electrode 220 may be configured to play a role as a data electrode.

The conductive adhesive layer 230 is formed on the substrate 210 where the first electrode 220 is located. Like a display device to which a light emitting element of a flip-chip type is applied, the conductive adhesive layer 230 may include one of an Anisotropic Conductive Film (ACF), an anisotropic conductive paste, a conductive particle contained solution and the like. Yet, in the present embodiment, a case of implementing the conductive adhesive layer 230 with the anisotropic conductive film is exemplified.

After the conductive adhesive layer has been placed in the state that the first electrode 220 is located on the substrate 210, if the semiconductor light emitting element 250 is connected by applying heat and pressure thereto, the semiconductor light emitting element 250 is electrically connected to the first electrode 220. In doing so, the semiconductor light emitting element 250 is preferably disposed to be located on the first electrode 220.

If heat and pressure is applied to an anisotropic conductive film, as described above, since the anisotropic conductive film has conductivity partially in a thickness direction, the electrical connection is established. Therefore, the anisotropic conductive film is partitioned into a conductive portion and a non-conductive portion.

Furthermore, since the anisotropic conductive film contains an adhesive component, the conductive adhesive layer 230 implements mechanical coupling between the semiconductor light emitting element 250 and the first electrode 220 as well as mechanical connection.

Thus, the semiconductor light emitting element 250 is located on the conductive adhesive layer 230, via which an individual pixel is configured in the display device. As the semiconductor light emitting element 250 has excellent luminance, an individual unit pixel may be configured in small size as well. Regarding a size of the individual semiconductor light emitting element 250, a length of one side may be equal to or smaller than 80 μm for example and the individual semiconductor light emitting element 250 may include a rectangular or square element. For example, the rectangular element may have a size equal to or smaller than 20 μm×80 μm.

The semiconductor light emitting element 250 may have a vertical structure.

Among the vertical type semiconductor light emitting elements, a plurality of second electrodes 240 respectively and electrically connected to the vertical type semiconductor light emitting elements 250 are located in a manner of being disposed in a direction crossing with a length direction of the first electrode 220.

Referring to FIG. 9, the vertical type semiconductor light emitting element 250 includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on then-type semiconductor layer 253. In this case, the p-type electrode 256 located on a bottom side may be electrically connected to the first electrode 220 by the conductive adhesive layer 230, and the n-type electrode 252 located on a top side may be electrically connected to a second electrode 240 described later. Since such a vertical type semiconductor light emitting element 250 can dispose the electrodes at top and bottom, it is considerably advantageous in reducing a chip size.

Referring to FIG. 8 again, a phosphor layer 280 may formed on one side of the semiconductor light emitting element 250. For example, the semiconductor light emitting element 250 may include a blue semiconductor light emitting element 251 emitting blue (B) light, and a phosphor layer 280 for converting the blue (B) light into a color of a unit pixel may be provided. In this regard, the phosphor layer 280 may include a red phosphor 281 and a green phosphor 282 configuring an individual pixel.

Namely, at a location of configuring a red unit pixel, the red phosphor 281 capable of converting blue light into red (R) light may be stacked on a blue semiconductor light emitting element. At a location of configuring a green unit pixel, the green phosphor 282 capable of converting blue light into green (G) light may be stacked on the blue semiconductor light emitting element. Moreover, the blue semiconductor light emitting element may be singly usable for a portion that configures a blue unit pixel. In this case, the unit pixels of red (R), green (G) and blue (B) may configure a single pixel.

Yet, the present disclosure is non-limited by the above description. In a display device to which a light emitting element of a flip-chip type is applied, as described above, a different structure for implementing blue, red and green may be applicable.

Regarding the present embodiment again, the second electrode 240 is located between the semiconductor light emitting elements 250 and connected to the semiconductor light emitting elements electrically. For example, the semiconductor light emitting elements 250 are disposed in a plurality of columns, and the second electrode 240 may be located between the columns of the semiconductor light emitting elements 250.

Since a distance between the semiconductor light emitting elements 250 configuring the individual pixel is sufficiently long, the second electrode 240 may be located between the semiconductor light emitting elements 250.

The second electrode 240 may be formed as an electrode of a bar type that is long in one direction and disposed in a direction vertical to the first electrode.

In addition, the second electrode 240 and the semiconductor light emitting element 250 may be electrically connected to each other by a connecting electrode protruding from the second electrode 240. Particularly, the connecting electrode may include a n-type electrode of the semiconductor light emitting element 250. For example, the n-type electrode is formed as an ohmic electrode for ohmic contact, and the second electrode covers at least one portion of the ohmic electrode by printing or deposition. Thus, the second electrode 240 and the n-type electrode of the semiconductor light emitting element 250 may be electrically connected to each other.

Referring to FIG. 8 again, the second electrode 240 may be located on the conductive adhesive layer 230. In some cases, a transparent insulating layer (not shown) containing silicon oxide (SiOx) and the like may be formed on the substrate 210 having the semiconductor light emitting element 250 formed thereon. If the second electrode 240 is placed after the transparent insulating layer has been formed, the second electrode 240 is located on the transparent insulating layer. Alternatively, the second electrode 240 may be formed in a manner of being spaced apart from the conductive adhesive layer 230 or the transparent insulating layer.

If a transparent electrode of Indium Tin Oxide (ITO) or the like is sued to place the second electrode 240 on the semiconductor light emitting element 250, there is a problem that ITO substance has poor adhesiveness to an n-type semiconductor layer. Therefore, according to the present disclosure, as the second electrode 240 is placed between the semiconductor light emitting elements 250, it is advantageous in that a transparent electrode of ITO is not used. Thus, light extraction efficiency can be improved using a conductive substance having good adhesiveness to an n-type semiconductor layer as a horizontal electrode without restriction on transparent substance selection.

Referring to FIG. 8 again, a partition 290 may be located between the semiconductor light emitting elements 250. Namely, in order to isolate the semiconductor light emitting element 250 configuring the individual pixel, the partition 290 may be disposed between the vertical type semiconductor light emitting elements 250. In this case, the partition 290 may play a role in separating the individual unit pixels from each other and be formed with the conductive adhesive layer 230 as an integral part. For example, by inserting the semiconductor light emitting element 250 in an anisotropic conductive film, a base member of the anisotropic conductive film may form the partition.

In addition, if the base member of the anisotropic conductive film is black, the partition 290 may have reflective property as well as a contrast ratio may be increased, without a separate block insulator.

For another example, a reflective partition may be separately provided as the partition 190. The partition 290 may include a black or white insulator depending on the purpose of the display device.

In case that the second electrode 240 is located right onto the conductive adhesive layer 230 between the semiconductor light emitting elements 250, the partition 290 may be located between the vertical type semiconductor light emitting element 250 and the second electrode 240 each. Therefore, an individual unit pixel may be configured using the semiconductor light emitting element 250. Since a distance between the semiconductor light emitting elements 250 is sufficiently long, the second electrode 240 can be placed between the semiconductor light emitting elements 250. And, it may bring an effect of implementing a flexible display device having HD image quality.

In addition, as shown in FIG. 8, a black matrix 291 may be disposed between the respective phosphors for the contrast ratio improvement. Namely, the black matrix 291 may improve the contrast between light and shade.

In one example, in the case of the semiconductor light emitting element, excellent light extraction efficiency is required to ensure high luminance and constant lifespan reliability.

Therefore, a method for forming a light extraction structure such as performing texturing on a surface of the element or forming periodic prominences and depressions (patterning) has been introduced. However, wet etching used as the method for forming the light extraction structure has a problem that it is difficult to control an etching rate and has a problem of reproducibility. In addition, dry etching using a fine-patterned mask has problems of increased manufacturing cost and damage by plasma.

A method for solving the above problems and forming the light extraction structure in a semiconductor light emitting element simply with low cost will be described in detail later with reference to FIGS. 10 to 28.

Figure 10:
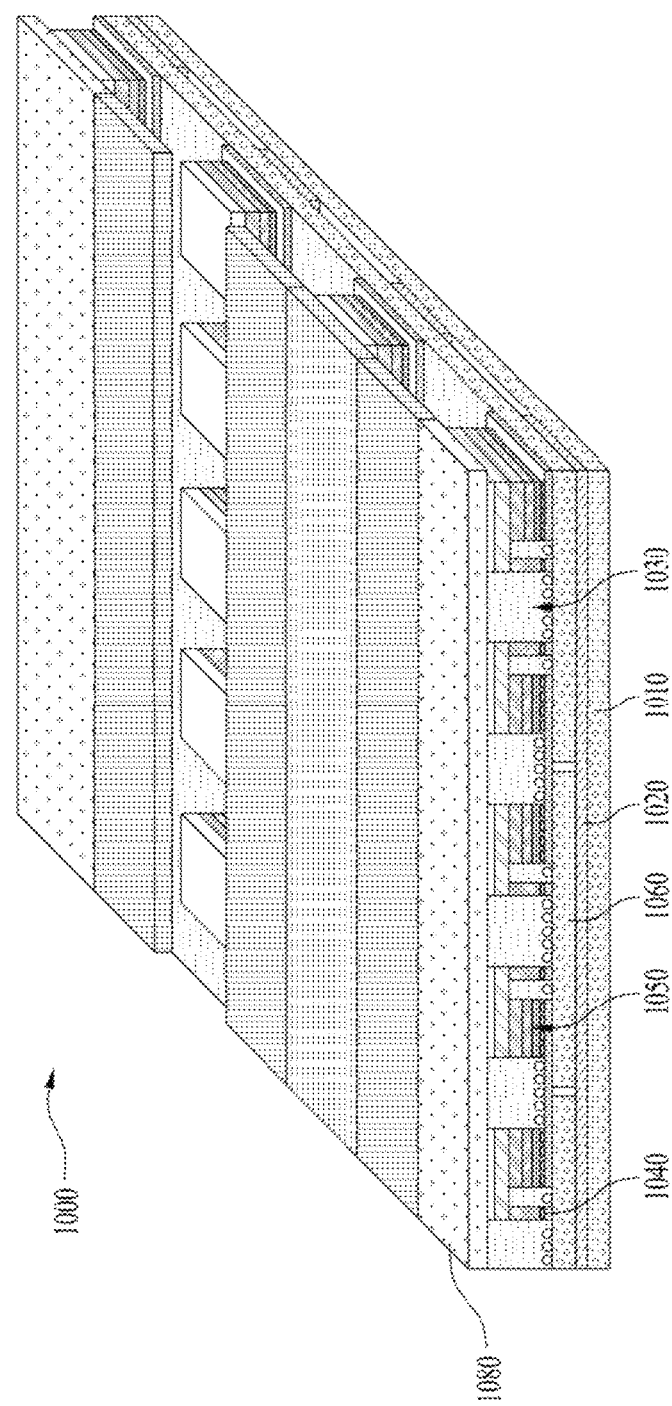
FIG. 10 is an enlarged view of a portion A in FIG. 1 for illustrating a display device using a semiconductor light emitting element having a light extraction structure according to another embodiment of the present disclosure.

FIG. 10 is an enlarged view of a portion A in FIG. 1 for illustrating a display device using a semiconductor light emitting element having a light extraction structure according to another embodiment of the present disclosure.

As shown in FIG. 10, as a display device 1000 using a semiconductor light emitting element, the display device 1000 using a flip-chip semiconductor light emitting element 1050 of a passive matrix (PM) scheme is exemplified. However, the example to be described below is also applicable to a semiconductor light emitting element of an active matrix (AM) scheme. In addition, technical characteristics of the semiconductor light emitting element 1050 are in the light extraction structure formed at an upper portion of the element. Thus, the flip-chip structure is merely exemplary, and the present disclosure is not limited thereto.

The display device 1000 includes a substrate 1010, a first electrode 1020, a conductive adhesive layer 1030, a second electrode 1040, and a plurality of semiconductor light emitting elements 1050. Herein, each of the first electrode 1020 and the second electrode 1040 may include a plurality of electrode lines.

In addition, the substrate 1010, which is a wiring substrate on which the first electrode 1020 is disposed, may contain polyimide (PI) to implement a flexible display device. In addition, any material that has insulating properties and is flexible may be used.

The first electrode 1020 may be positioned on the substrate 1010 and may be formed as an electrode in a form of a bar long in one direction. The first electrode 1020 may be constructed to serve as a data electrode.

The conductive adhesive layer 1030 is formed on the substrate 1010 on which the first electrode 1020 is located. Like the display device to which the above-described flip-chip type light emitting element is applied, the conductive adhesive layer 1030 may be the anisotropic conductive film (ACF), the anisotropic conductive paste, the solution containing the conductive particles, or the like.

Between the semiconductor light emitting elements 1050, a plurality of second electrodes 1040 directed in a direction intersecting a longitudinal direction of the first electrode 1020 and electrically connected to the semiconductor light emitting elements 1050 are located.

As shown in FIG. 10, the second electrode 1040 may be positioned on the conductive adhesive layer 1030. That is, the conductive adhesive layer 1030 is disposed between the wiring substrate and the second electrode 1040. The second electrode 1040 may be electrically connected to the semiconductor light emitting element 1050 by being in contact therewith.

By the structure described above, the plurality of semiconductor light emitting elements 1050 are coupled to the conductive adhesive layer 1030 and is electrically connected to the first electrode 1020 and the second electrode 1040.

As shown in FIG. 10, the plurality of semiconductor light emitting elements 1050 may form a plurality of columns in a direction parallel to a plurality of electrode lines equipped in the first electrode 1020. However, the present disclosure is not necessarily limited thereto. For example, the plurality of semiconductor light emitting elements 1050 may form the plurality of columns along the second electrode 1040.

Furthermore, the display device may further include a phosphor conversion layer 1080 formed on one surface of each of the plurality of semiconductor light emitting elements 1050.

In addition, in order to improve contrast of such phosphor conversion layer 1080, the display device may further include a black matrix disposed between respective phosphors. The black matrix may be formed in a scheme of defining a gap between phosphor dots, and filling the gap with a black material. Therefore, the black matrix may absorb reflected external light and improve the contrast of light and dark at the same time. Such black matrix is positioned between the respective phosphor conversion layers along the first electrode 1020, which is directed in a direction in which the phosphor conversion layer 1080 is stacked. In this case, the phosphor conversion layer is not formed at a position corresponding to a blue semiconductor light emitting element, but the black matrices are able to be formed on both sides of a space without the phosphor conversion layer therebetween.

Figure 11:
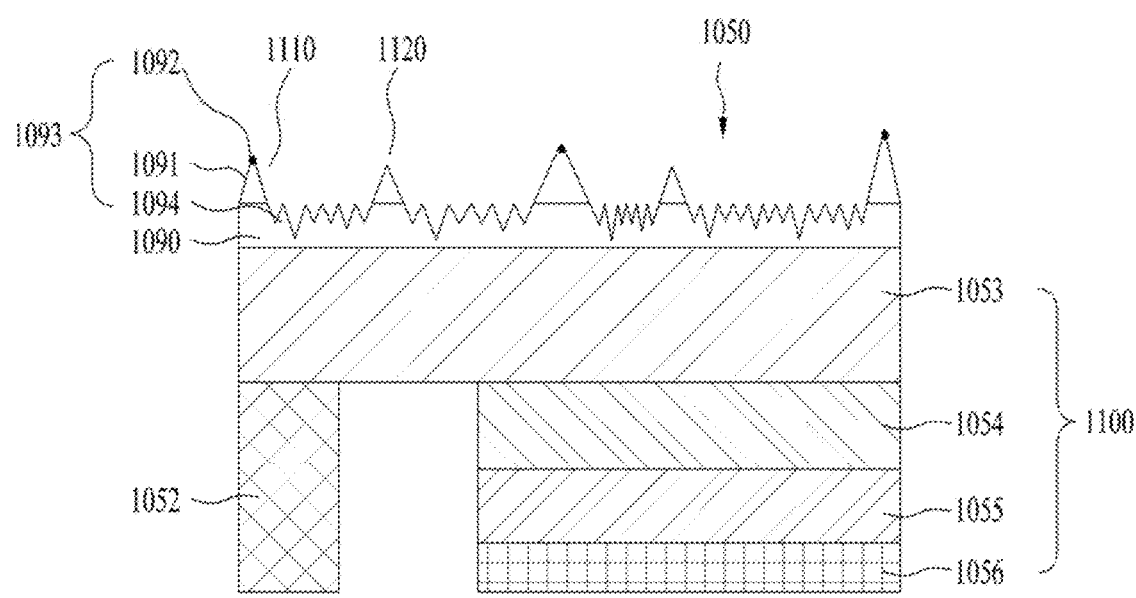
FIG. 11 is a detailed cross-sectional view of a semiconductor light emitting element having a light extraction structure in FIG. 10.

FIG. 11 is a detailed cross-sectional view of a semiconductor light emitting element having a light extraction structure in FIG. 10.

The semiconductor light emitting element 1050 may include a semiconductor light emitting structure 1100 including a first conductivity type semiconductor layer 1055, an active layer 1054, and a second conductivity type semiconductor layer 1053, and a light extraction structure 1093.

In addition, a first conductivity type electrode 1056 electrically connected to the first conductivity type semiconductor layer 1055 and a second conductivity type electrode 1052 electrically connected to the second conductivity type semiconductor layer may be further included.

As described above, the flip-chip structure shown in FIG. 11 is merely exemplary, and the present disclosure is not limited thereto. For example, various shapes of semiconductor light emitting elements having the light extraction structure 1093 may be included in the scope of the present disclosure.

In addition, the semiconductor light emitting element 1050 may include a buffer semiconductor layer 1090. The buffer semiconductor layer 1090 serves to reduce damage applied to the semiconductor light emitting element 1050 when the light extraction structure 1093 is formed on the semiconductor light emitting structure 1100. However, the formation of the buffer semiconductor layer 1090 is only an example, and the present disclosure is not limited thereto. Therefore, the light extraction structure 1093 may be directly formed on the first conductivity type semiconductor layer 1055 or the second conductivity type semiconductor layer 1053.

However, for a smooth description of the present disclosure, for example, it is assumed that the semiconductor light emitting element 1050 including the light extraction structure 1093 includes the buffer semiconductor layer 1090, and a main component of the semiconductor light emitting element is GaN.

As shown in FIG. 11, the light extraction structure 1093 includes a surface roughness pattern formed on the semiconductor layer. The surface roughness pattern may also be a prominence and depression pattern formed on the semiconductor layer.

For example, the surface roughness pattern is formed in a certain region of a top surface of the buffer semiconductor layer 1090. The top surface of the buffer semiconductor layer 1090 is composed of a first interface at which a first organic protrusion among a plurality of organic protrusions is located, a second interface at which a second organic protrusion is located, and a third interface that is located between the first interface and the second interface and at which an organic protrusion is not located, and the surface roughness pattern is formed on the third interface.

As shown in FIG. 11, for example, interfaces on which one organic protrusion 1110 and another organic protrusion 1120 are positioned of the top surface of the buffer semiconductor layer 1090 is relatively flat. However, it may be seen that an irregular surface roughness pattern 1094 is formed at an interface, which is located between the interfaces on which the organic protrusions 1110 and 1120 are located, on which the organic protrusion is not located.

As shown in FIG. 11, in the case of the semiconductor light emitting element 1050, five organic protrusions are formed, and the irregular surface roughness patterns are formed on surfaces of four places between the protrusions. The surface may be expressed differently as the interface. This is because the surface will again become the interface in contact with another organic component in a subsequent process in which the semiconductor light emitting element 1050 is constructed as the display device. In addition, the number of the prominences and depressions and the shape of the interface are merely exemplary, and the present disclosure is not limited thereto.

The surface roughness structure serves to increase the light extraction efficiency. In a case of the GaN semiconductor light emitting element, a light escape angle (or a critical angle) is small at a flat surface or an interface due to the high refractive index (in the range from 2.3 to 2.8) compared to the surrounding materials. Therefore, in order to increase the efficiency with which the light generated by the active layer 1054 of the semiconductor light emitting element 1050 is extracted to the outside, the rougher the surface or interface of the semiconductor layer positioned in a light travel path, the more advantageous it is.

As shown in FIG. 11, the light extraction structure 1093 may further include the plurality of organic protrusions. The plurality of organic protrusions protrude in a vertical direction of the semiconductor layer. In addition, among the organic protrusions, for example, one organic protrusion 1110 has nanoparticles 1092 at an end thereof, and is composed of an organic component 1091 supporting the nanoparticles. In addition, another organic protrusion 1120 does not have the nanoparticles, and forms the protrusion only with the organic component.

Such difference, which will be described later, naturally occurs in the manufacturing process for forming the light extraction structure 1093. For the light extraction structure 1093, an organic layer in which the nanoparticles are dispersed is formed, and the organic layer is ashed and etched. In this connection, organic protrusions protruding irregularly may be formed during the etching process depending on a height and a dispersion degree of the nanoparticles located in the organic layer.

In addition, although a main purpose of the etching process is to etch the semiconductor layer to have the surface roughness pattern, because the nanoparticles may also be removed in the etching process, for example, the organic protrusion that does not contain the nanoparticles may exist in the organic protrusions.

In one example, a refractive index of the organic protrusion is lower than that of the semiconductor layer. Considering the refractive index of GaN, for example, it is preferable for the organic protrusion to have a refractive index between 1.5 and 2. When the light travels, the greater the difference in refractive index between two media, the smaller the critical angle, so that the light extraction efficiency decreases. Thus, the refractive index of the organic protrusion is lower than the refractive index of the semiconductor layer, but is adjusted to be in an appropriate range such that the difference from the refractive index of the semiconductor layer is not great. This is able to be adjusted by selecting a type of an organic component of the organic layer and a type of the nanoparticles dispersed in the organic layer.

FIG. 12 shows cross-sectional views showing semiconductor light emitting elements having a light extraction structure at various positions.

As shown in FIG. 12A, a light extraction structure 1193 may be formed on top of the buffer semiconductor layer 1190.

In addition, as shown in FIG. 12B, a light extraction structure 1293 may be formed on top of the second conductivity type semiconductor layer 1153 without the separate buffer semiconductor layer.

In addition, as shown in FIG. 12C, light extraction structures 1393 and 1493 may be formed on top of the buffer semiconductor layer 1290 and beneath the second conductivity type semiconductor layer 1253, respectively.

However, the formation position of the light extraction structure is only an example, and the present disclosure is not limited thereto.

Figure 13:
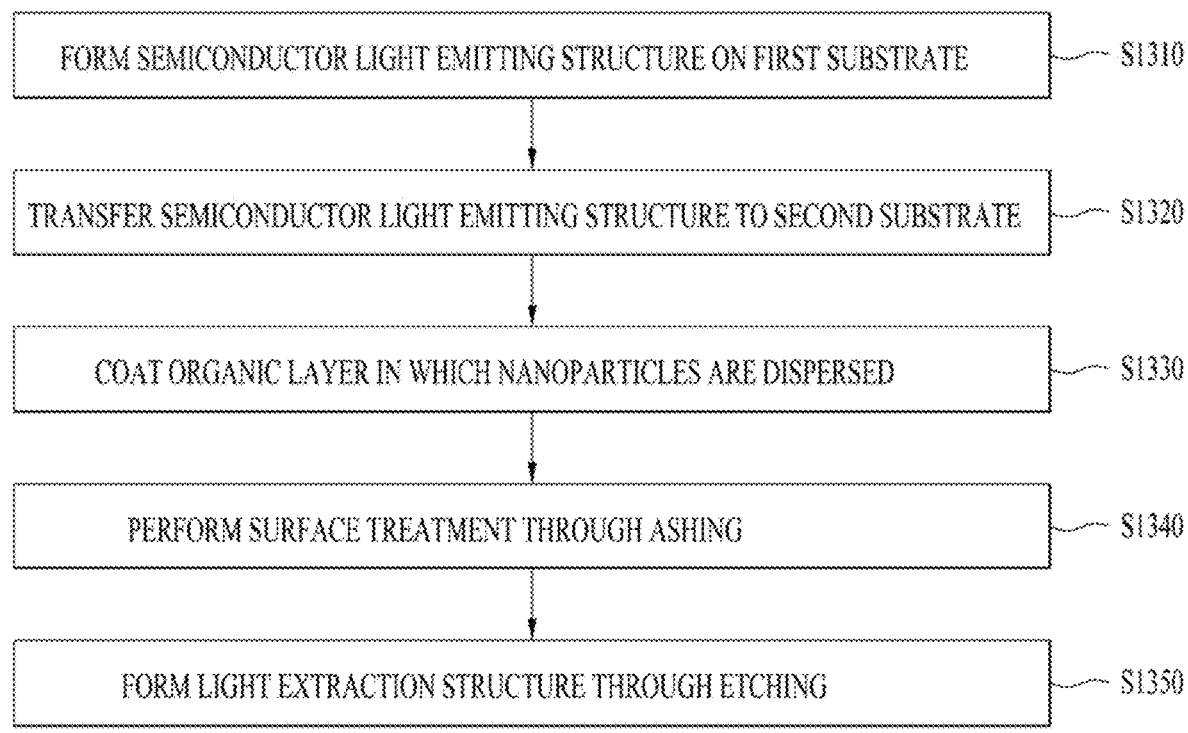
FIG. 13 is a flowchart illustrating a process of manufacturing a semiconductor light emitting element in FIG. 11.

FIG. 13 is a flowchart illustrating a process of manufacturing a semiconductor light emitting element in FIG. 11.

First, the semiconductor light emitting structure is formed on the first substrate (S1310). The semiconductor light emitting structure may include the first conductivity type semiconductor layer, the active layer, and the second conductivity type semiconductor layer, and in some cases, may further include the buffer semiconductor layer. In the case of the flip-chip structure semiconductor light emitting element, the electrodes for electrically connecting the semiconductor layers to each other are formed on the first substrate.

Thereafter, the semiconductor light emitting structure is transferred to a second substrate (S1320). The transferring operation is selectively performed based on the position where the light extraction structure is to be formed in the semiconductor light emitting element. For example, in order to form the light extraction structure at an uppermost end of the semiconductor light emitting structure stacked on the first substrate, there is no need to perform the separate transferring operation. However, in order to form the light extraction structure on a semiconductor layer (e.g., the buffer semiconductor layer) that is first grown on the first substrate, the light extraction structure needs to be transferred to the second substrate using the flip-chip scheme to expose a surface of the buffer semiconductor layer. In one example, the second substrate may be a temporary substrate for secondary transfer, and may be a final substrate to which wiring is connected.

Thereafter, the organic layer in which the nanoparticles are dispersed is coated on top of the semiconductor layer to form the light extraction structure (S1330). For such coating, for example, a spin coating method is used. By adjusting spin speed and time, an organic solution in which the nanoparticles are dispersed is thinly applied to the top of the semiconductor layer.

The coating process (S1330) includes an operation of soft baking by heat. The soft baking is a process of removing a volatile solvent to remove fluidity of the organic solution.

The nanoparticle includes an inorganic particle or a metal particle. For example, it is assumed that the nanoparticle includes at least one of $TiO_2$, $ZnO$, $ZrO_2$, $SiO_2$, $Al_2O_3$, and $SiN_x$. In addition, an etching ratio of the nanoparticles is smaller than an etching ratio of the semiconductor layer constituting the semiconductor light emitting element. As will be described later, this is to use the organic layer containing the nanoparticles as an etching mask.

Further, the organic layer contains a photosensitive organic component. When the photosensitive organic component constitutes the organic layer, only a specific region may be patterned through a photo-lithography process to remain. That is, the organic layer may remain only in the specific region of the semiconductor light emitting element, and then, the light extraction structure may be formed only in the specific region.

Thereafter, a surface treatment of the organic layer is performed through the ashing process (S1340). The coated organic layer has a certain thickness, and has a flat surface, so that a surface of the organic layer is roughened through the ashing process.

The ashing process (S1340) is mainly performed in a short time using O2 plasma. In the organic layer in which the nanoparticles are dispersed, organic component regions other than the nanoparticles may be easily removed by O2 plasma. That is, as a plasma treatment time elapses, the organic component is removed from the surface of the organic layer, and the nanoparticles remain, so that the surface of the organic layer has a curved shape in which the nanoparticles protrude.

Thereafter, the etching process is performed using the organic layer containing the protruding nanoparticles as the etching mask to form the light extraction structure (S1350). For the etching, dry etching of performing anisotropic etching using a plasma or a reactive ion gas or wet etching of performing isotropic etching using chemicals may be used. However, in the case of the wet etching, there is a risk that the entire organic layer is lost by the isotropic etching, so that the etching process is preferably performed using the dry etching using the plasma.

Through the dry etching, an entire region of the organic layer is etched with a certain directionality. The directionality is generally a direction perpendicular to the semiconductor layer, but is able to be adjusted through the etching apparatus.

In one example, the organic component and the nanoparticle in the organic layer have different etching ratios, which are ratios at which the organic component and the nanoparticle is etched within the same time. In the present disclosure, the nanoparticle is composed of a metal or an inorganic material, so that the nanoparticle has an etching ratio lower than that of the organic component. Therefore, even when a certain time elapses in the etching process, there is a high probability that the nanoparticle is not well etched and remains on the surface of the organic layer or the semiconductor layer. In addition, because the shape in which a certain amount of nanoparticles are protruding has already formed on the surface of the organic layer through the ashing process (S1340), which is a pre-treatment operation, the protruding shape becomes more prominent through the etching process. That is, the organic protrusion containing the nanoparticles may be formed on the surface of the semiconductor layer. The organic protrusion has the nanoparticles at the end thereof, and is composed of the organic component supporting the nanoparticles. However, the protruding nanoparticles formed in the ashing process (S1340) may also be etched when the dry etching process is performed for a long time, so that the nanoparticles may not exist at the end of the organic protrusion.

In one example, the organic layer of the concave region where the nanoparticles do not exist through the ashing process (S1340) will be further etched through the etching process. Furthermore, the semiconductor layer beneath the organic layer will also be etched.

Therefore, after the etching process, the plurality of organic protrusions will be formed on the surface of the semiconductor layer, and the semiconductor layer will be etched in the region where the organic protrusion is not formed to form the irregular surface roughness pattern. The surface roughness pattern is a major factor constituting the light extraction structure of the present disclosure.

Figure 14:
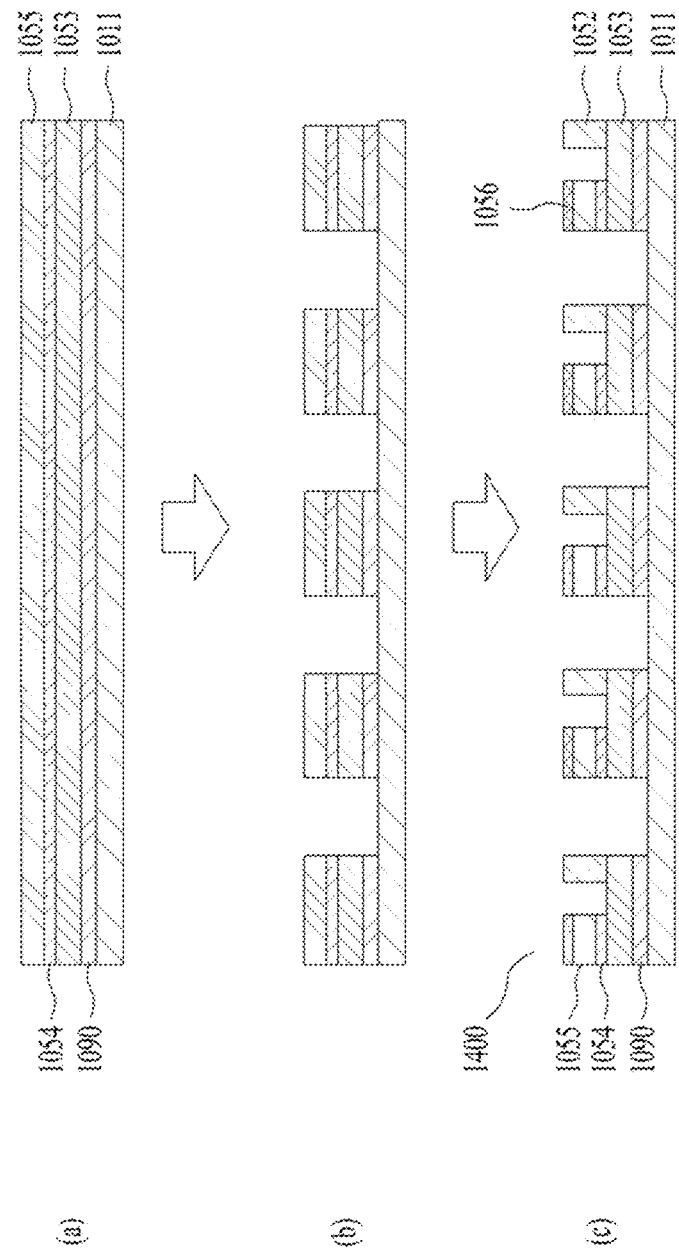
FIG. 14 shows cross-sectional views illustrating a process of forming a semiconductor light emitting structure in FIG. 11 on a first substrate.

FIG. 14 shows cross-sectional views illustrating a process of forming a semiconductor light emitting structure in FIG. 11 on a first substrate.

As shown in FIG. 14A, the buffer semiconductor layer 1090, the second conductivity type semiconductor layer 1053, the active layer 1054, and the first conductivity type semiconductor layer 1055 are sequentially grown on the first substrate 1011.

The buffer semiconductor layer 1090 is formed beneath the second conductivity type semiconductor layer 1053, as shown in FIG. 14A. The buffer semiconductor layer 1090 may prevent in advance damage of the second conductivity type semiconductor layer 1053 that may occur in the process of separating the semiconductor light emitting structure grown on the first substrate. In addition, the buffer semiconductor layer 1090 plays a role in alleviating damage caused by the plasma occurred during the etching process for forming the light extraction structure.

In one example, the buffer semiconductor layer 1090 is grown to have a thickness within a range, for example, from 0.5 μm to 3 μm. This is because, when the thickness of the buffer semiconductor layer 1090 is smaller than 0.5 μm, it is difficult for the buffer semiconductor layer 1090 to completely absorb an impact applied when separating the semiconductor light emitting structure from the growing substrate. In addition, this is because, when the thickness of the buffer semiconductor layer 1090 exceeds 3 μm, the light extraction efficiency may decrease due to the thickness when, for example, the buffer semiconductor layer is positioned in the light travel path.

In one example, although the buffer semiconductor layer 1090 is separately shown in FIG. 14, the buffer semiconductor layer 1090 is optional as described above. For example, when the second conductivity type semiconductor layer 1053 is grown relatively thick, the second conductivity type semiconductor layer 1053 also functions as the buffer semiconductor layer 1090.

In one example, the first substrate 1011 may be formed of a material having a light-transmitting property, for example, one of sapphire (Al2O3), GaN, ZnO, and AlO. In addition, the first substrate 1011 may be formed of a material suitable for semiconductor material growth, a carrier wafer. The first substrate 1011 may be formed of a material having excellent thermal conductivity. Including a conductive substrate or an insulating substrate, for example, a SiC substrate having higher thermal conductivity compared to a sapphire (Al2O3) substrate or at least one of Si, GaAs, GaP, InP, and Ga2O3 may be used for the first substrate 1011, but the present disclosure may not be limited thereto.

Further, the second conductivity type semiconductor layer 1053, which is an n-type semiconductor layer, may be a nitride semiconductor layer such as n-GaN, and the first conductivity type semiconductor layer 1055 may be a p-type semiconductor layer. However, the present disclosure is not necessarily limited thereto. The first conductivity type may be the n-type and the second conductivity type may be p-type.

In addition, according to another embodiment of the present disclosure, the first conductivity type semiconductor layer 1055 and the second conductivity type semiconductor layer 1053 may be formed by implanting impurities into an intrinsic or doped semiconductor substrate. In addition, a region in which a p-n junction is formed by the impurity implantation may serve as the active layer 1054. The listed detail of the first conductivity type semiconductor layer 1055, the second conductivity type semiconductor layer 1053, and the active layer 1054 are exemplary only, and the present disclosure is not limited thereto.

As shown in FIG. 14B, the semiconductor layer grown on the first substrate forms a plurality of semiconductor light emitting elements isolated from each other through the etching process.

For example, the plurality of semiconductor light emitting elements isolated from each other are formed on the substrate by etching at least a portion of the first conductivity type semiconductor layer, the active layer, the second conductivity type semiconductor layer, and the buffer semiconductor layer. In this case, the etching may be performed until the first substrate is exposed.

As another example, the etching may be performed to a state in which a portion of the second conductivity type semiconductor layer is left between the semiconductor light emitting elements.

As shown in FIG. 14C, a first conductivity type electrode 1056 and a second conductivity type electrode 1052 may be formed in each of the plurality of semiconductor light emitting structures 1400. In order to form the electrodes, a photo process, an etching process, and a metal deposition process may be performed for each electrode. Therefore, finally, on the first substrate 1011, the plurality of semiconductor light emitting structures 1400 in which the first conductivity type electrode 1056, the second conductivity type electrode 1052, the first conductivity type semiconductor layer 1055, the active layer 1054, the second conductivity type semiconductor layer 1053, and the buffer semiconductor layer 1090 are formed may be formed. The semiconductor light emitting element 1050 may further include, for example, a passivation layer formed to surround a side surface of the semiconductor light emitting structure 1400.

Figure 15:
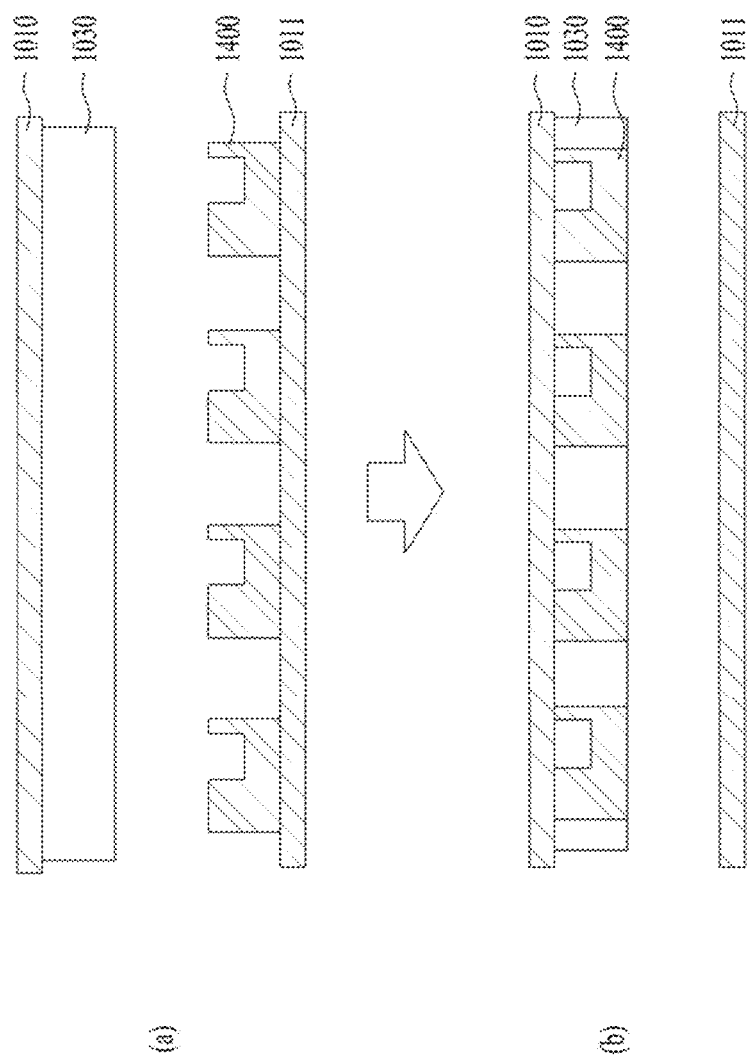
FIG. 15 shows cross-sectional views illustrating a method for transferring a semiconductor light emitting structure in FIG. 14 to a second substrate.

FIG. 15 shows cross-sectional views illustrating a method for transferring a semiconductor light emitting structure in FIG. 14 to a second substrate. As described above, the substrate to which the semiconductor light emitting structure is transferred may be, for example, a temporary substrate for secondary transfer, and may be a final substrate including a wiring electrode.

As shown in FIG. 15A, the semiconductor light emitting structure 1400 of the first substrate 1011 may be transferred to a second substrate 1010 through an adhesive film 1030 formed on the second substrate 1010.

In the transfer process, a laser lift off (LLO) process may be performed to selectively separate the semiconductor light emitting structure 1400 of the first substrate 1011. That is, when a laser is irradiated to the semiconductor light emitting structure 1400 to be separated from the first substrate 1011, the first substrate 1011 and the corresponding semiconductor light emitting element 1400 may be separated from each other.

The adhesive film of the second substrate 1010 may be a flexible film suitable for the selective transfer. As shown in FIG. 15B, all of the semiconductor light emitting structures 1400 separated from the first substrate 1011 may be adhered to the adhesive film 1030 of the second substrate 1010. Because the adhesive film 1030 is flexible, the semiconductor light emitting structure 1400 is stably fixed on the adhesive film 1030.

The semiconductor light emitting structure 1400 transferred by the adhesive film 1030 becomes to have a light extraction structure through a subsequent process, and is able to be transferred to a third substrate. When the second substrate 1010 is the wiring substrate or the final substrate, as the adhesive film 1030, a conductive adhesive film for electrical connection to the semiconductor light emitting structure 1400 may be used.

Figure 16:
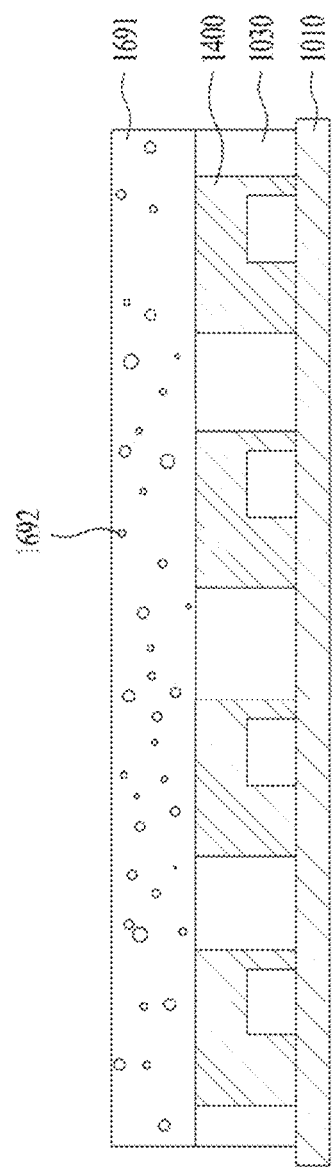
FIG. 16 is a cross-sectional view showing an organic layer containing nanoparticles coated on a semiconductor light emitting structure in FIG. 15.

FIG. 16 is a cross-sectional view showing an organic layer containing nanoparticles coated on a semiconductor light emitting structure in FIG. 15.

As shown in FIG. 16, the adhesive film 1030 positioned on the second substrate 1010 and the transferred semiconductor light emitting structure 1400 may form a flat surface. Therefore, an organic layer 1691 in which nanoparticles 1692 are dispersed may be coated on the surface using a method such as spin coating. In the case of the spin coating, it is possible to adjust a coating thickness relatively simply by adjusting rotation speed and time, and it is advantageous for coating an organic layer of a large area. However, the coating method is merely exemplary, and the present disclosure is not limited thereto.

More specifically, an organic solution in which countless nanoparticles are dispersed is applied on top of the semiconductor light emitting structure 1400 through the spin coating method.

Thereafter, a volatile component (solvent) of the organic solution is removed through a soft baking process, and a relatively solidified organic layer 1691 is formed on top of the semiconductor light emitting structure 1400.

In addition, a component of the organic layer includes, for example, a photosensitive organic component. The photosensitive organic component may be a photosensitive acrylate or a photo active compound (PAC).

In addition, the nanoparticles may be, for example, an inorganic material or a metal component of a size in a range from 10 nm to 300 nm.

Figure 17:
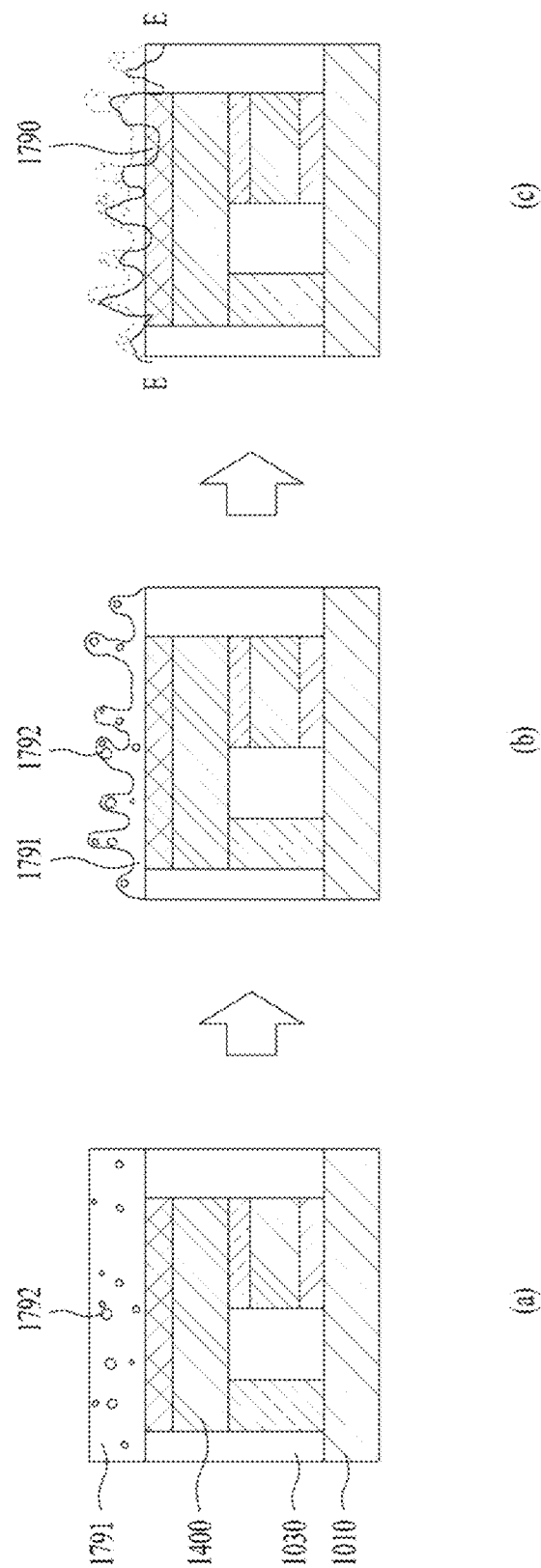
FIG. 17 is a cross-sectional view for each process operation for forming organic protrusions and irregular interfaces on a top surface of a semiconductor light emitting structure in FIG. 16.

FIG. 17 is a cross-sectional view for each process operation for forming organic protrusions and irregular interfaces on a top surface of a semiconductor light emitting structure in FIG. 16.

FIG. 17A is a cross-sectional view of the semiconductor light emitting structure 1400 coated with an organic layer 1791, positioned on the substrate 1010 shown in FIG. 16.

Countless nanoparticles 1792 are dispersed in the organic layer 1791.

FIG. 17B is a cross-sectional view showing a shape of the semiconductor light emitting structure coated with the organic layer in FIG. 17A after the ashing process. A shape of the surface of the organic layer is changed through the ashing process by, for example, exposing the surface of the organic layer to the O2 plasma for several seconds. Because the O2 plasma is effective in removing the organic layer rather than the nanoparticles, the nanoparticles are exposed at the surface of the organic layer as the plasma treatment continues.

Specifically, as shown in FIG. 17B, after the ashing process, the plurality of nanoparticles 1792 are exposed at the surface of the organic layer 1791, and the organic component supporting the nanoparticles is formed beneath the nanoparticles, so that the organic layer 1791 has the irregular surface shape around the nanoparticles.

FIG. 17C is a cross-sectional view illustrating a shape after the etching of the semiconductor light emitting structure after the ashing process in FIG. 17B.

The semiconductor light emitting structure in FIG. 17C includes a buffer semiconductor layer 1790. A portion of the buffer semiconductor layer is etched in a shape like, for example, a line E-E.

As shown in FIG. 17C, referring to the line E-E, the protrusion structure including the nanoparticles formed in the ashing operation is also etched. However, because the etching ratio of the nanoparticles is lower than that of the organic component or the buffer semiconductor layer 1790, the protruding structure may be more pronounced.

As a result, after the etching process, the organic protrusion containing some nanoparticles and the organic protrusion not containing the nanoparticles may be formed on a top surface of the buffer semiconductor layer 1790.

In addition, the surface of the buffer semiconductor layer 1790 on which the organic protrusion is not formed may form the irregular surface roughness pattern as the buffer semiconductor layer itself is etched. The surface roughness pattern and the organic protrusion may form the light extraction structure of the semiconductor light emitting element, thereby improving the light extraction efficiency.

A vertical level difference in the surface roughness pattern is preferably several tens of nm to several hundreds of nm. That is, by forming the vertical level difference corresponding to a wavelength of a visible light region, the light extraction efficiency may be increased.

Figure 18:
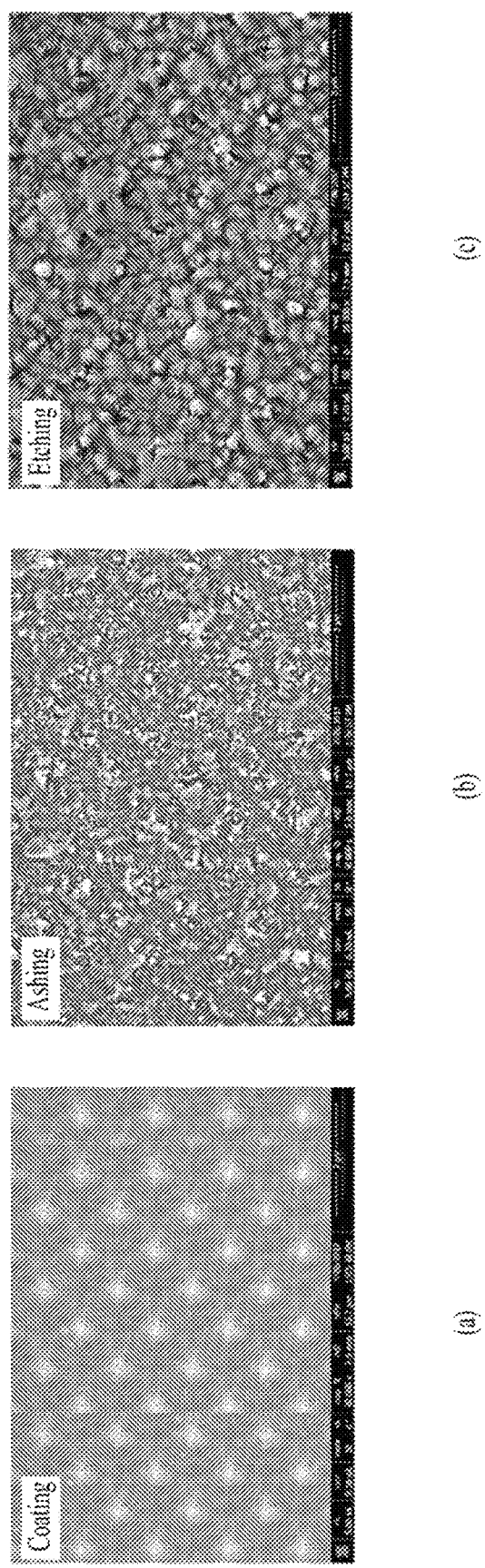
FIG. 18 is a planar SEM image for each process operation for manufacturing a semiconductor light emitting element having a light extraction structure.

FIG. 18 is a planar SEM image for each process operation for manufacturing a semiconductor light emitting element having a light extraction structure.

FIG. 18A is a scanning electron microscope (SEM) image of a surface coated with the organic layer containing the nanoparticles. As may be seen from the SEM image, the nanoparticles are well dispersed without agglomeration. It may also be expected that the countless nanoparticles will be dispersedly present even beneath the coated surface.

FIG. 18B is an SEM image after the ashing treatment by the O2 plasma of the surface coated with the organic layer in FIG. 18A.

Some agglomerated lumps are observed, but the lumps are formed by the aggregation of the remaining organic component while the organic component is removed by the O2 plasma. In addition, the organic component lump may be easily removed in the etching process, which is the subsequent process. Therefore, it may be observed that the countless nanoparticles are exposed on the surface, except for the organic component lump. The nanoparticles are nanoparticles that were not removed by the O2 plasma exposed on the surface of the organic layer.

FIG. 18C is an SEM image after performing the etching process on the surface in FIG. 18B.

It may be seen that countless organic protrusion structures are formed on the surface. The organic protrusion may contain the nanoparticles at the end thereof, and may be composed only of the organic component in which the nanoparticles do not exist.

Figure 19:
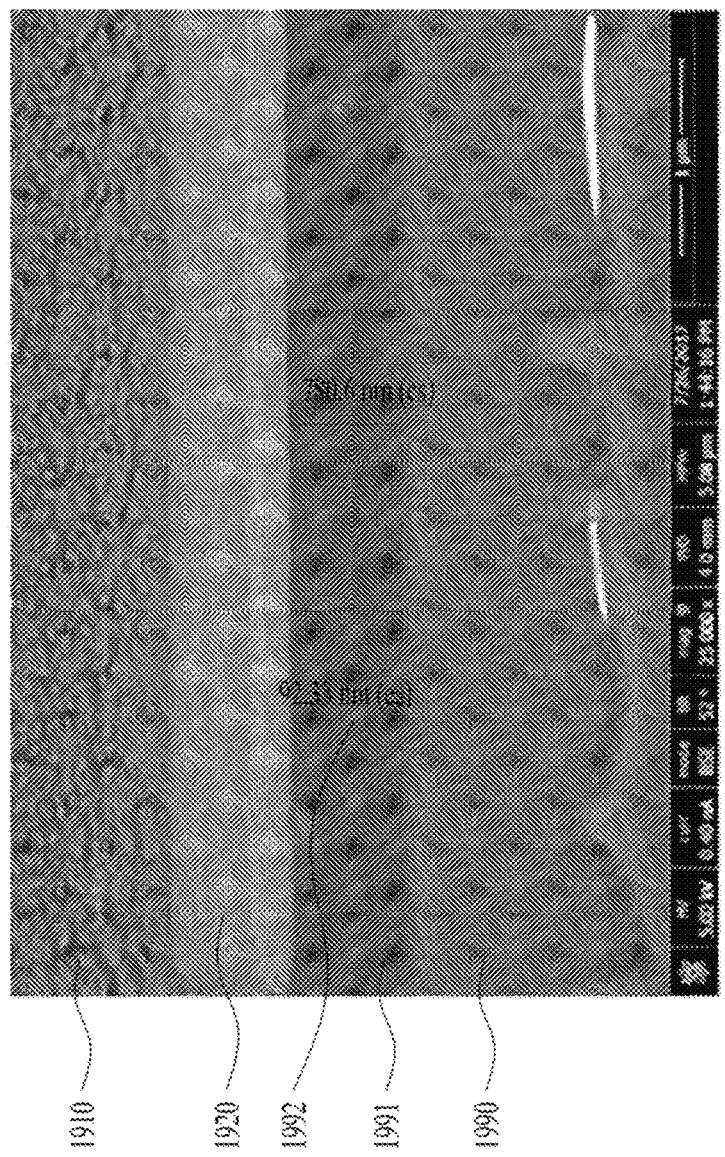
FIG. 19 is a cross-sectional SEM image of a semiconductor light emitting structure coated with an organic layer containing nanoparticles.

FIG. 19 is a cross-sectional SEM image of a semiconductor light emitting structure coated with an organic layer containing nanoparticles.

In order to obtain the cross-sectional SEM image, the semiconductor light emitting structure was cut in a cross-sectional direction using a focused ion beam (FIB) apparatus. In addition, as shown in FIG. 19, a separate metal buffer layer 1920 was applied in order not to damage the semiconductor light emitting structure in the cutting process, and a thin conductive layer 1910 was coated for a precise SEM image. The metal buffer layer 1920 and the conductive layer 1910 are irrelevant to the semiconductor light emitting structure. Through nanoparticles 1992, an organic layer 1991, and a semiconductor layer 1990 observed below the metal buffer layer, the cross-sectional image of FIG. 18A may be identified.

Specifically, it is observed that the nanoparticles 1992 having a size in a range from several tens of nm to 300 nm exist, and a thickness of the organic layer 1991 is about 780 nm.

In addition, a surface of the organic layer 1991 is flat without a protruding portion, and it is observed that an interface between the organic layer 1991 and the semiconductor layer 1990 is also flat without a protruding portion.

Figure 20:
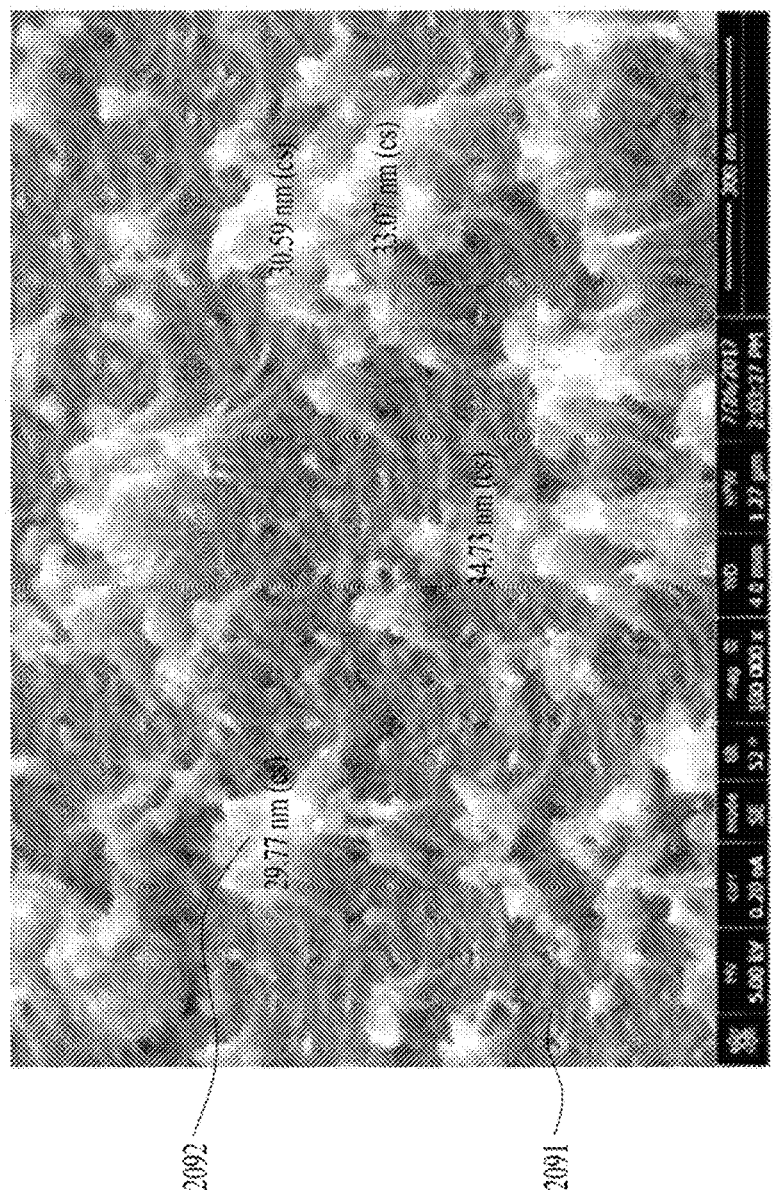
FIG. 20 is a side surface SEM image of a semiconductor light emitting structure coated with an organic layer containing nanoparticles after an ashing process.

FIG. 20 is a side surface SEM image of a semiconductor light emitting structure coated with an organic layer containing nanoparticles after an ashing process.

As shown in FIG. 20, many nanoparticles protrude from the surface of the organic layer, and the shape of the organic component supporting the nanoparticles is observed. The size of the nanoparticles is observed to be at a level of several tens of nm. A portion of the organic layer except for the organic component supporting the nanoparticles is removed in the ashing process, so that a bottom of the organic layer is almost exposed. On the other hand, the semiconductor layer was not etched by the ashing treatment such as the O2 plasma. Thus, the bottom surface shown in the SEM image is in a shape in which the organic component remains thin or a surface of a portion of the semiconductor layer is exposed.

Figure 21:
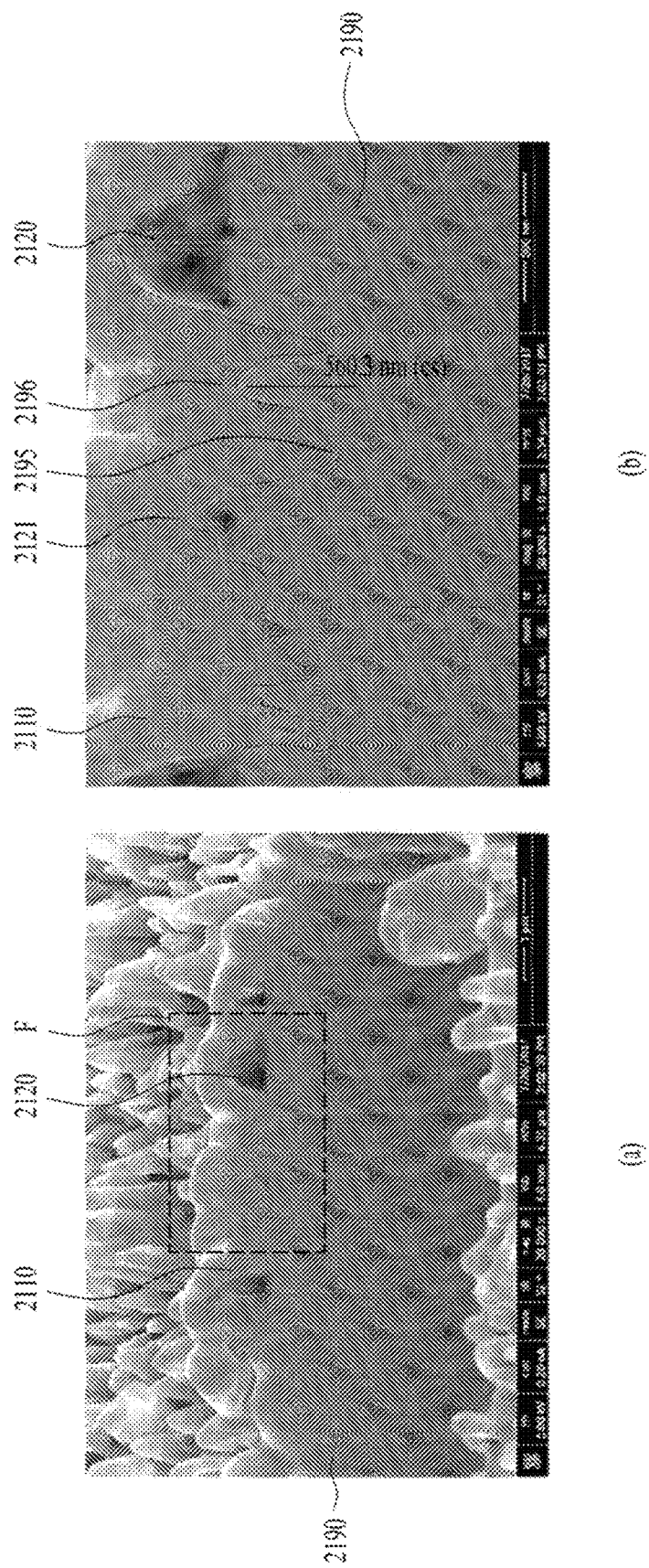
FIG. 21 shows FIB-SEM images of a semiconductor light emitting structure coated with an organic layer containing nanoparticles after ashing and etching processes.

FIG. 21 shows FIB-SEM images of a semiconductor light emitting structure coated with an organic layer containing nanoparticles after ashing and etching processes.

As shown in FIG. 21A, numerous protruding regions exist at a top of the semiconductor layer 2190. The regions are formed by the organic protrusions formed after the ashing and etching processes, and an additional conductive polymer layer 2110 coated on top of the organic protrusions. For utilization as an actual semiconductor light emitting element, for example, it is common to form a phosphor conversion layer on top of the semiconductor light emitting element. In the case of the image in FIG. 21A, the conductive polymer layer 2110 was further coated as described above in order to more clearly observe a shape of an interface between the organic protrusion 2120 and the semiconductor layer 2190.

Specifically, FIG. 21A is an SEM image obtained by loading the semiconductor light emitting element after the etching process into the FIB apparatus to be subjected to a cross-section treatment, and then, observing the semiconductor light emitting element at an inclination angle of 52 degrees. The interfaces of the semiconductor layer 2190 is divided into an interface on which the organic protrusions are located, and an interface on which the organic protrusions are not located and in direct contact with the conductive polymer layer 2110.

FIG. 21B is an enlarged cross-sectional view of a region F in FIG. 21A. Regions darkly protruding in the image of FIG. 21B are organic protrusions 2120 and 2121 formed by the etching process. In general, SEM equipment realizes an image by detecting an amount of secondary electrons generated after colliding accelerating electrons with an object. In the case of the organic component, an amount of secondary electrons generated is small, so that the regions are represented dark.

While an interface between the organic protrusions 2120 and 2121 and the semiconductor layer 2190 is flat, the interface of the semiconductor layer 2190 on which the organic protrusion does not exist has the irregularly formed surface roughness pattern.

More specifically, between the first organic protrusion 2121 and the second organic protrusion 2120, a difference in vertical level of a maximum vertical level point 2196 and a minimum vertical level point 2195 of the interface of the semiconductor layer 2190 on which the organic protrusion does not exist is about 560 nm. That is, it may be seen that the surface of the semiconductor layer 2190 in the region was etched through the etching process at a maximum of 560 nm, and thus, the irregular surface roughness pattern was formed.

The surface roughness pattern has the vertical level difference of several hundred nm, and accordingly, forms various inclination angles in a direction perpendicular to the surface of the semiconductor layer. For example, when light generated in the active layer of the semiconductor light emitting element travels to the irregular surface of the semiconductor layer, various light escape angles may be provided.

Figure 22:
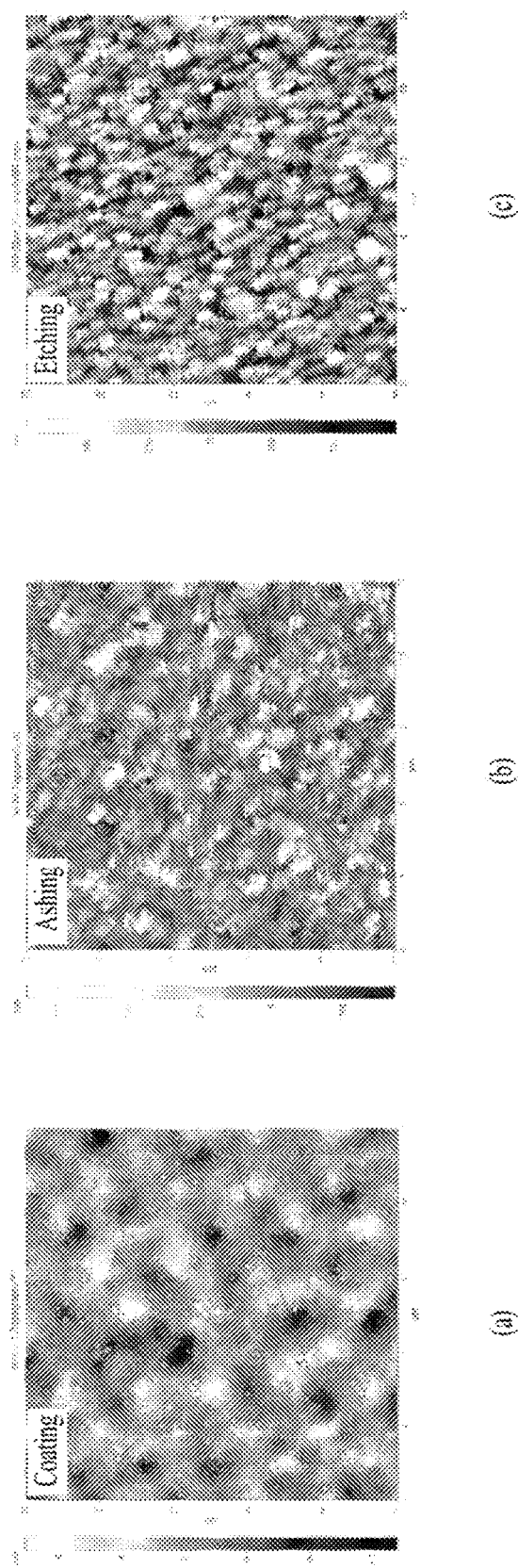
FIG. 22 is a planar AFM image for each process operation for manufacturing a semiconductor light emitting element having a light extraction structure.

FIG. 22 is a planar AFM image for each process operation for manufacturing a semiconductor light emitting element having a light extraction structure.

FIG. 22A is an image of a surface roughness measured by an atomic force microscope (AFM) after coating the organic layer on the surface of the semiconductor light emitting structure, FIG. 22B is a planar AFM image of a surface roughness after the ashing and FIG. 22C is a planar AFM image of a surface roughness after the ashing and the etching.

As shown in FIG. 22A, a great surface roughness is not obtained through the coating alone. However, as shown in FIG. 22B, it may be seen that the surface is rougher compared to FIG. 22A after the ashing process. Further, as shown in FIG. 22C, the protruding region of the surface may be identified more clearly after the etching process.

Figure 23:
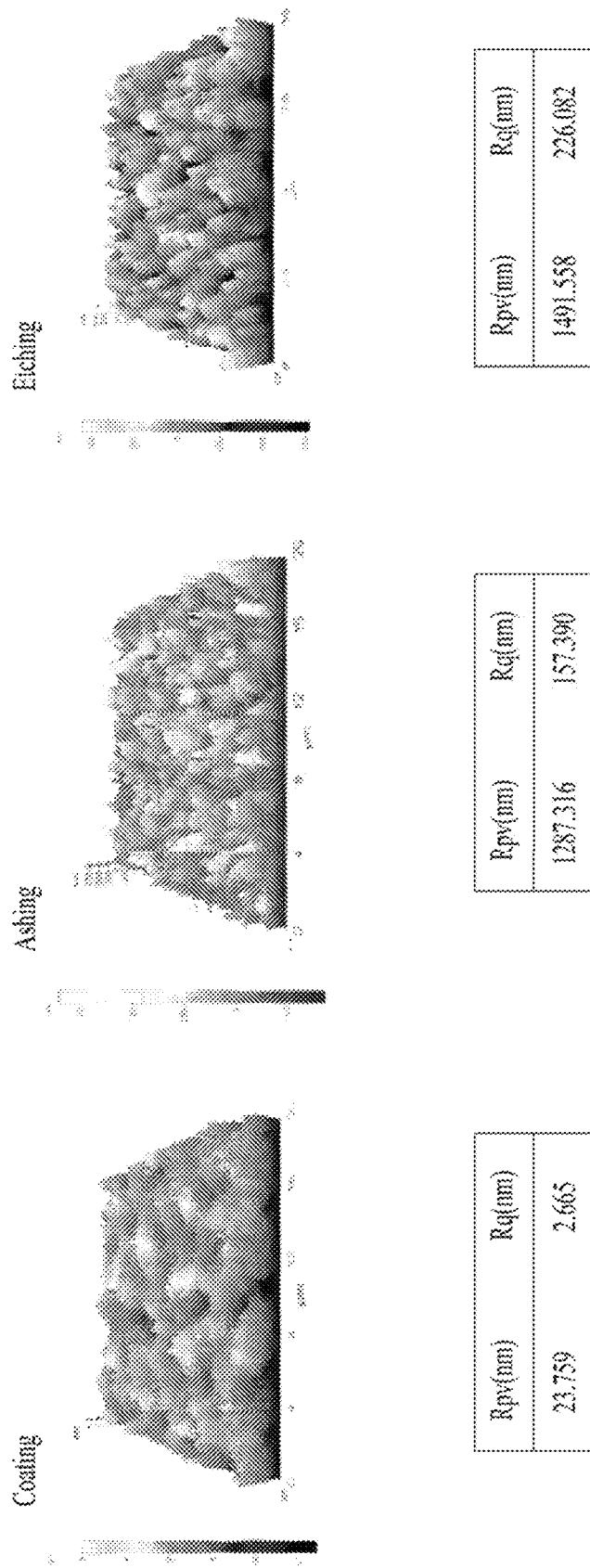
FIG. 23 shows a surface roughness and a side surface AFM image for each process operation for manufacturing a semiconductor light emitting element having a light extraction structure.

FIG. 23 shows a surface roughness and a side surface AFM image for each process operation for manufacturing a semiconductor light emitting element having a light extraction structure.

It may be seen that the surface roughness changes based on each process operation also in FIGS. 23A to 23C showing the side surface AFM images for the respective processes. Looking at the identification result quantitatively, it may be seen that, when only the coating process is performed, as shown in FIG. 23A, the surface is very flat as a difference Rpv between a maximum vertical level and a minimum vertical level of the surface of the organic layer is about 23 nm, and a mean square roughness Rq representing an average roughness is about 3 nm.

On the other hand, as shown in FIG. 23B, after the ashing process, the difference between the maximum vertical level and the minimum vertical level of the surface is about 1290 nm, and the mean square roughness is about 160 nm. It may be seen that the surface is about 60 times rougher than that in FIG. 23A before the ashing process. In other words, it may be seen that the roughness of the flat organic layer in which the nanoparticles are dispersed has increased as the organic layer becomes to have the protruding structure around the nanoparticles through the ashing process. However, as described above, the ashing process generally only changes the shape of the surface of the organic layer, but does not change the shape of the interface of the semiconductor layer.

In addition, as shown in FIG. 23C, after the etching process, the difference between the maximum vertical level and the minimum vertical level of the surface is about 1490 nm, and the mean square roughness is about 226 nm. That is, after the ashing process, the roughness has increased through the etching process again. This increase in the roughness is resulted from irregular etching of the interface of the semiconductor layer rather than the change in the shape of the surface of the organic layer.

Figure 24:
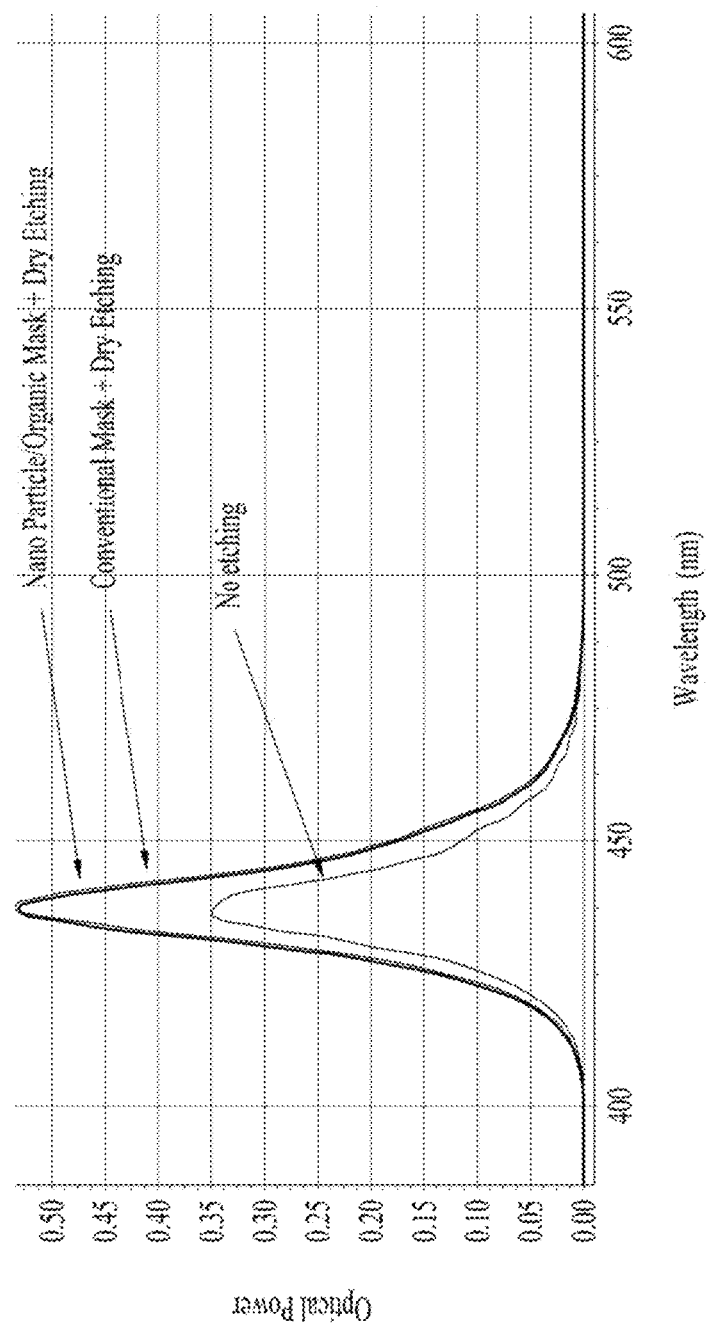
FIG. 24 is a graph showing light intensity for each wavelength of a semiconductor light emitting element having a light extraction structure of the present disclosure and semiconductor light emitting elements according to the related art.

FIG. 24 is a graph showing light intensity for each wavelength of a semiconductor light emitting element having a light extraction structure of the present disclosure and semiconductor light emitting elements according to the related art.

In the case of the GaN semiconductor light emitting element, the refractive index is high compared to that of the surrounding material, so that the light extraction efficiency is low as the light generated from the element is totally reflected inside the element. Therefore, the light extraction structure is generally formed on the surface of the semiconductor light emitting element through the etching process.

FIG. 24 largely compares light intensities for each wavelength of three types of semiconductor light emitting elements, and the light intensities are normalized values for relative comparison.

In addition, the three types of semiconductor light emitting elements are the element that has not been subjected to the etching process (No etching), the element that has been subjected to the dry etching process using the mask as in the conventional scheme (Conventional Mask+Dry Etching), and the element that has been subjected to the dry etching process using the organic component containing the nanoparticles as the etching mask as in the present disclosure (Nano Particle/Organic Mask+Dry Etching), respectively.

Specifically, the light intensity of the non-etched element is about 0.35 based on a central peak, and the light intensities of the two etched elements are about 0.55 based on the central peak. That is, it may be seen that the light intensity increased by about 50% by the light extraction structure formed through the etching.

In addition, as shown in FIG. 24, it may be seen that the light intensities of the element that has been subjected to the dry etching using the organic component containing the nanoparticles as the etching mask and the element that has been subjected to the dry etching by manufacturing the expensive mask are similar to each other.

In order to use the semiconductor light emitting element as a large-area display device, for example, the semiconductor light emitting element should be manufactured to have a size of several tens of rim, and the light extraction structure formed in the individual semiconductor light emitting element should be manufactured to have a size of several tens to hundreds of nm. Therefore, the prior art is not suitable for the large-area display device in consideration of a manufacturing cost of the mask for forming the fine pattern of several tens of nm and a difficulty of the precise subsequent process using the mask.

On the other hand, the present disclosure uses the etching mask manufactured by the ashing process after the organic layer containing the nanoparticles is coated. Thus, the light extraction structure is formed by a simple and low-cost method, and an effect is similar to that of the prior art.

Figure 25:
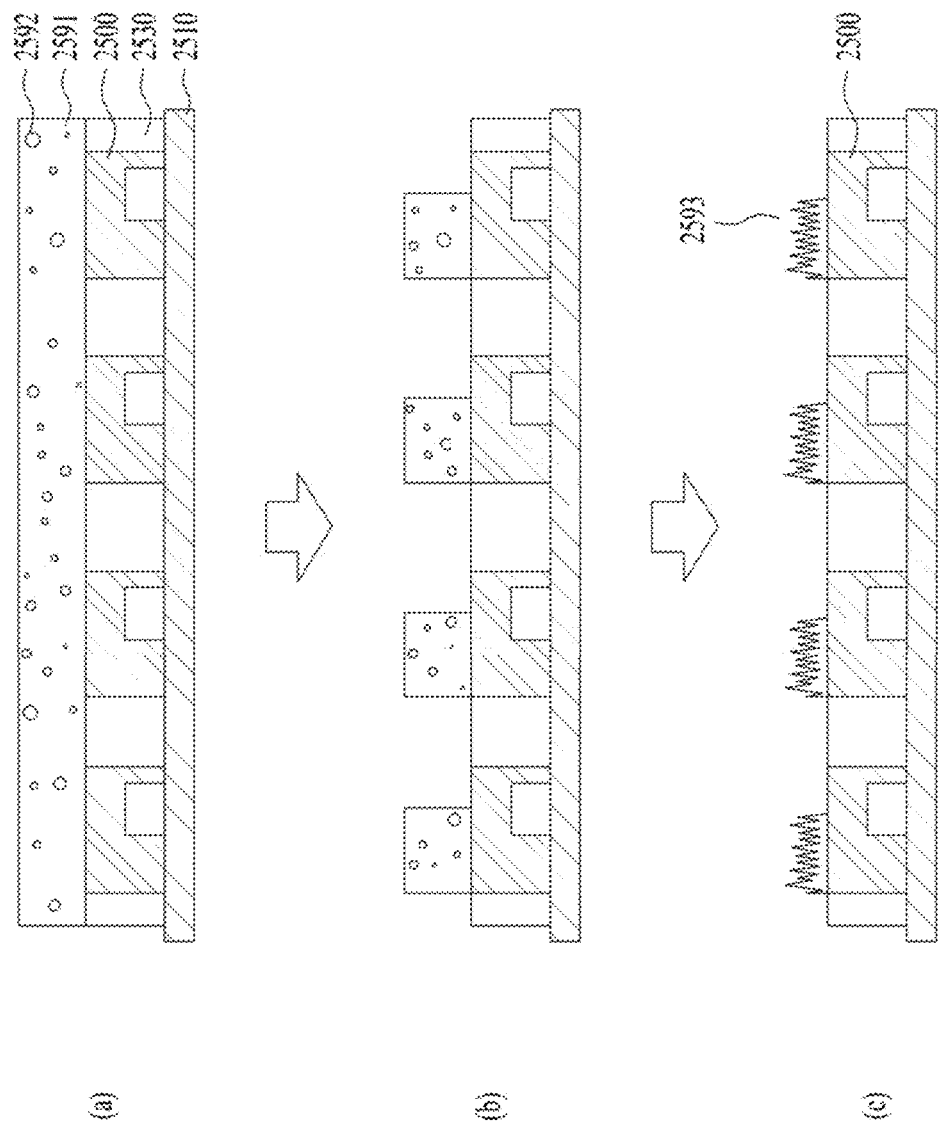
FIG. 25 shows cross-sectional views illustrating a process of forming a light extraction structure in only a partial region of a semiconductor light emitting structure using a photosensitive organic layer.

FIG. 25 shows cross-sectional views illustrating a process of forming a light extraction structure in only a partial region of a semiconductor light emitting structure using a photosensitive organic layer.

As shown in FIG. 25A, an organic layer 2592 containing nanoparticles 2591 is coated on top of a semiconductor light emitting structure 2500 fixed on a substrate 2510 by an adhesive film 2530.

Because the organic layer is made of the photosensitive material, the organic layer is able to be patterned through the photo-lithography. Thus, as shown in FIG. 25B, the organic layer may be formed only in a partial region on top of the semiconductor light emitting structure.

When performing the ashing and the etching treatment on the coated organic layer, as shown in FIG. 25C, a light extraction structure 2593 may be formed only in the partial region of the semiconductor light emitting structure 2500.

Figure 26:
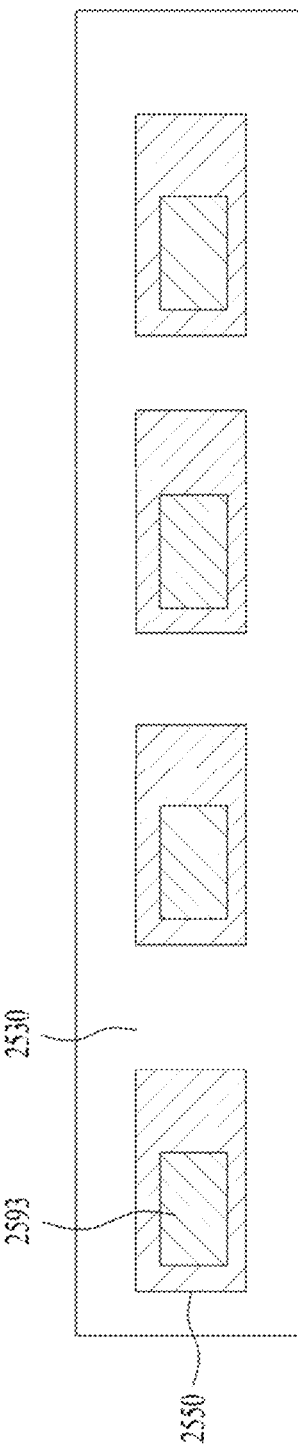
FIG. 26 is a plan view of semiconductor light emitting elements in which a light extraction structure is formed only in a partial region in FIG. 25.

FIG. 26 is a plan view of semiconductor light emitting elements in which a light extraction structure is formed only in a partial region in FIG. 25.

For example, when there is no separate patterning process, the light extraction structure may be formed in entire regions of the adhesive film and the semiconductor light emitting element. However, as shown in FIG. 26, the light extraction structure 2593 may be formed only in the partial region of the individual semiconductor light emitting element 2550 through the patterning process.

The partial region may be a region overlapping the active layer of the semiconductor light emitting element. The reason for forming the light extraction structure only in the specific region of the semiconductor light emitting element is to prevent re-absorption of the light by the phosphor conversion layer that may be formed on top of the light extraction structure as much as possible. Specific details thereof will be described later with reference to FIGS. 27 and 28.

Figure 27:
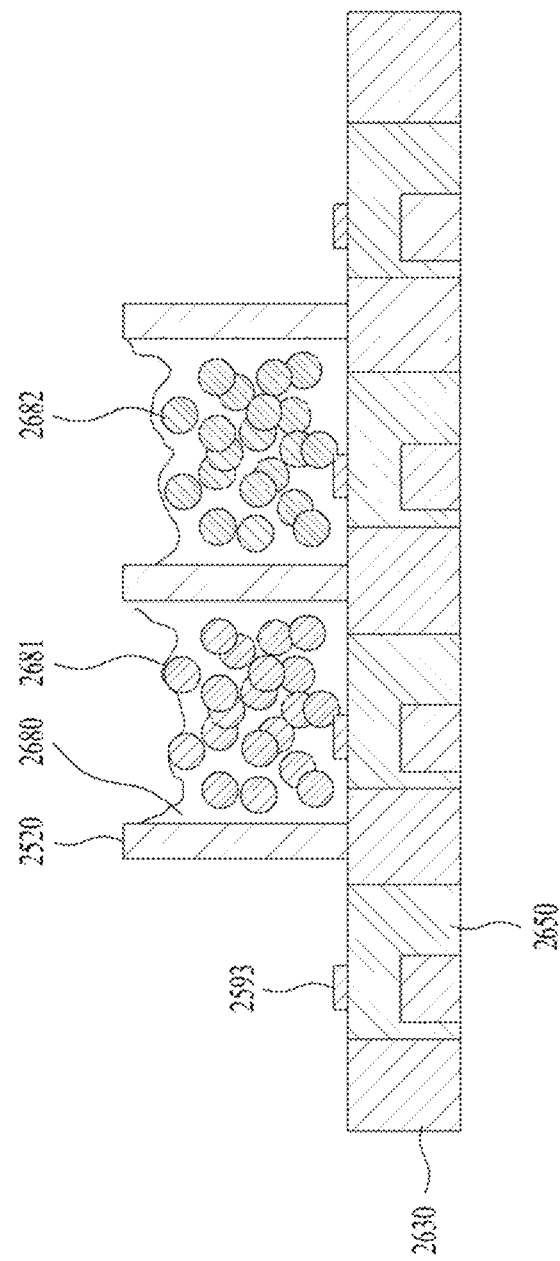
FIG. 27 is a cross-sectional view after a phosphor conversion layer is disposed on top of semiconductor light emitting elements in FIG. 25.

FIG. 27 is a cross-sectional view after a phosphor conversion layer is disposed on top of semiconductor light emitting elements in FIG. 25.

As shown in FIG. 27, the light extraction structure 2593 is formed in the specific region of the semiconductor light emitting element 2650 fixed to the adhesive film 2630.

In addition, for convenience of description, a phosphor conversion layer 2680 is formed only on top of some semiconductor light emitting elements. The phosphor conversion layer 2680 performs a function of converting the light generated by the semiconductor light emitting element into light having the color of the sub-pixel.

For example, when the semiconductor light emitting element generates blue light, a green phosphor 2681 is disposed to convert the blue light into green light. A red phosphor 2682 may convert the blue light into red light, and a partition wall 2520 may be formed to distinguish the phosphor conversion layers 2680.

The phosphor conversion layer 2680 contains a fluorescent material such as quantum dots (QD) or an inorganic phosphor. When the light generated from the semiconductor light emitting element collides with the fluorescent material, the light may be reflected and re-absorbed back into the semiconductor light emitting element.

Figure 28:
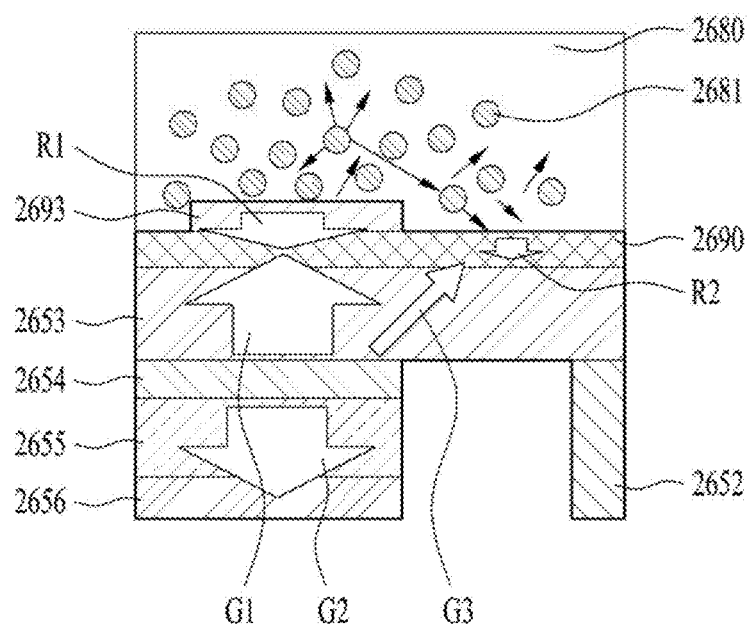
FIG. 28 is a cross-sectional view showing a light extraction effect of a semiconductor light emitting element in which a light extraction structure is formed only in a partial region in FIG. 25.

FIG. 28 is a cross-sectional view showing a light extraction effect of a semiconductor light emitting element in which a light extraction structure is formed only in a partial region in FIG. 25.

As shown in FIG. 28, the semiconductor light emitting element includes a first conductivity type electrode 2656, a second conductivity type electrode 2652, a first conductivity type semiconductor layer 2655, an active layer 2654, a second conductivity type semiconductor layer 2653, a buffer semiconductor layer 2690, and a light extraction structure 2693.

In addition, the phosphor conversion layer 2680 is disposed on top of the semiconductor light emitting element, and countless phosphors 2681 are dispersed inside the phosphor conversion layer 2680.

In addition, light beams G1, G2, and G3 generated in the active layer 2654 travel in various directions. However, for example, when a reflective film is disposed on a side surface of the semiconductor light emitting element, most of the light beams will travel in a direction overlapping the active layer 2654.

In addition, the generated light is emitted to the outside by the light extraction structure 2693 formed on top of the active layer 2654. The light emitted to the outside will be reflected and refracted again by the phosphor 2681 of the phosphor conversion layer 2680.

Some of the light beams reflected by the phosphor 2681 may, for example, travel back toward the semiconductor light emitting element, and a certain amount thereof may be re-absorbed into the element.

In addition, the re-absorbed light beams R1 and R2 are more likely to be re-absorbed in a region in which the light extraction structure 2693 is formed than in a region in which the light extraction structure is not formed. This is because the region having the separate light extraction structure has various light escape angles to make light extraction and absorption smooth while both the extraction and absorption of the light are difficult in the region in which the surface of the element is flat due to the high refractive index of the semiconductor light emitting element itself.

Therefore, from a viewpoint of the light extraction, it is advantageous to have a wide light extraction structure, but from a viewpoint of light reabsorption, it is advantageous in increasing the external luminous efficiency of the element not to have the light extraction structure.

That is, in the display device having the phosphor conversion layer, the light extraction structure of the semiconductor light emitting element should be formed in the region overlapping the active layer to increase the amount of light emitted to the outside. At the same time, not forming the light extraction structure in the remaining region of the semiconductor light emitting element is advantageous to reduce the re-absorbed light in the future.

The above description is merely illustrative of the technical idea of the present disclosure. Those of ordinary skill in the art to which the present disclosure pertains will be able to make various modifications and variations without departing from the essential characteristics of the present disclosure.

Therefore, embodiments disclosed in the present disclosure are not intended to limit the technical idea of the present disclosure, but to describe, and the scope of the technical idea of the present disclosure is not limited by such embodiments.

The scope of protection of the present disclosure should be interpreted by the claims below, and all technical ideas within the scope equivalent thereto should be construed as being included in the scope of the present disclosure.

The invention claimed is:

1. A semiconductor light emitting element for a display device, the semiconductor light emitting element comprising:
    a semiconductor light emitting structure including a first conductivity type semiconductor layer, an active layer, and a second conductivity type semiconductor layer; and
    a light extraction structure disposed on top of the second conductivity type semiconductor layer of the semiconductor light emitting structure,
    wherein the light extraction structure includes:
    a plurality of organic protrusions protruding in a vertical direction of the second conductivity type semiconductor layer; and
    a surface roughness pattern formed on at least a portion of a top surface of the second conductivity type semiconductor layer,
    wherein at least one of the plurality of organic protrusions contains nanoparticles positioned at an end of the at least one of the plurality of organic protrusions and an organic component supporting the nanoparticles, and
    wherein the organic component is a photosensitive organic component.

2. The semiconductor light emitting element of claim 1, wherein the nanoparticles and the second conductivity type semiconductor layer have different etching ratios, and a first etching ratio of the nanoparticles is lower than a second etching ratio of the second conductivity type semiconductor layer.

3. The semiconductor light emitting element of claim 1, wherein a first refractive index of the plurality of organic protrusions is less than a second refractive index of the second conductivity type semiconductor layer.

4. The semiconductor light emitting element of claim 1, wherein the nanoparticles include at least one of $TiO_2$, $ZnO$, $ZrO_2$, $SiO_2$, $Al_2O_3$, or SiNx.

5. The semiconductor light emitting element of claim 1, wherein the semiconductor light emitting element is a micro light emitting diode (micro-LED) having a micrometer unit size.

6. The semiconductor light emitting element of claim 1, wherein one of the first conductivity type semiconductor layer and the second conductivity type semiconductor layer is a P-type GaN layer, and the other is an N-type GaN layer.

7. The semiconductor light emitting element of claim 1, wherein the photosensitive organic component includes at least one of a photosensitive acrylate or a photo active compound (PAC).

8. A display device, comprising:
    a display panel including a plurality of subpixels and configured to display images,
    wherein each of one or more of the plurality of subpixels includes the semiconductor light emitting element of claim 1.

9. A method for manufacturing a semiconductor light emitting element for a display device, the method comprising:
    forming a semiconductor light emitting structure including a first conductivity type semiconductor layer, an active layer, and a second conductivity type semiconductor layer on a first substrate;
    coating an organic layer on top of the semiconductor light emitting structure, the organic layer containing nanoparticles;
    ashing a surface of the organic layer and exposing one or more of the nanoparticles; and
    etching, after the performing the ashing, portions of the organic layer and a portion of the top of the semiconductor light emitting structure to form a light extraction structure on the semiconductor light emitting structure,
    wherein a remaining portion of the organic layer remaining after the ashing is used as an etching mask for etching the portion of the top of the semiconductor.

10. The method of claim 9, wherein the light extraction structure includes an irregular surface roughness pattern formed on a top surface of the semiconductor light emitting structure by the etching.

11. The method of claim 10, wherein the light extraction structure includes a plurality of organic protrusions formed by the etching process, and wherein at least one of the plurality of organic protrusions has at least one of the nanoparticles positioned at an end of the at least one of the plurality of organic protrusions.

12. The method of claim 9, further comprising transferring the semiconductor light emitting structure to a second substrate between the forming of the semiconductor light emitting structure and the coating of the organic layer.

13. The method of claim 9, wherein the coating of the organic layer includes applying an organic solution on the top of the semiconductor light emitting structure, and performing soft baking on the organic solution by heat after the applying the organic solution.

14. The method of claim 10, wherein the organic layer is a photosensitive organic layer, and
wherein the method further includes forming the light extraction structure only in a region overlapping the active layer of the semiconductor light emitting structure through a photo-lithography process.

15. The method of claim 9, wherein the semiconductor light emitting structure includes a buffer semiconductor layer, and
wherein the organic layer is coated on top of the buffer semiconductor layer of the semiconductor light emitting element.

16. The method of claim 9, wherein the ashing uses an $O_2$ plasma.

17. The method of claim 9, further comprising assembling the semiconductor light emitting structure into a display device.

18. A semiconductor light emitting element, comprising:
a semiconductor light emitting structure including a first conductivity type semiconductor layer, an active layer, and a second conductivity type semiconductor layer; and
a light extraction structure disposed on the semiconductor light emitting structure,
wherein the light extraction structure includes:
a surface roughness pattern; and
a plurality of organic protrusions including an organic component disposed on the surface roughness pattern, and
wherein the organic component is a photosensitive organic component, and
wherein at least one of the plurality of organic protrusions contains a nanoparticle.

19. The semiconductor light emitting element of claim 18, wherein a refractive index of the plurality of organic protrusions is less than a refractive index of the second conductivity type semiconductor layer.

20. The semiconductor light emitting element of claim 17, wherein the nanoparticle includes at least one of $TiO_2$, ZnO, $ZrO_2$, $SiO_2$, $Al_2O_3$, or SiNx.

21. A display device, comprising:
a display panel including a plurality of subpixels and configured to display images,
wherein each of one or more of the plurality of subpixels includes the semiconductor light emitting element of claim 18.

* * * * *